United States Patent
Driscoll et al.

(10) Patent No.: US 8,604,461 B2
(45) Date of Patent: Dec. 10, 2013

(54) SEMICONDUCTOR DEVICE STRUCTURES WITH MODULATED DOPING AND RELATED METHODS

(75) Inventors: Daniel Carleton Driscoll, Raleigh, NC (US); Ashonita Chavan, Raleigh, NC (US); Adam William Saxler, Durham, NC (US)

(73) Assignee: Cree, Inc., Durham, NC (US)

(*) Notice: Subject to any disclaimer, the term of this patent is extended or adjusted under 35 U.S.C. 154(b) by 949 days.

(21) Appl. No.: 12/639,493

(22) Filed: Dec. 16, 2009

(65) Prior Publication Data

US 2011/0140083 A1   Jun. 16, 2011

(51) Int. Cl.
*H01L 29/15*   (2006.01)

(52) U.S. Cl.
USPC ............................................................. 257/15

(58) Field of Classification Search
USPC .................................. 257/13–16; 438/47–48
See application file for complete search history.

(56) References Cited

U.S. PATENT DOCUMENTS

| | | |
|---|---|---|
| 4,152,044 A | 5/1979 | Liu |
| 4,914,489 A | 4/1990 | Awano |
| 4,963,948 A | 10/1990 | Awano |
| 5,034,783 A | 7/1991 | Chang et al. |
| 5,206,527 A | 4/1993 | Kuwata |
| 5,294,833 A | 3/1994 | Schetzina |
| 5,351,255 A | 9/1994 | Schetzina |
| 5,366,927 A | 11/1994 | Schetzina |
| 5,393,993 A | 2/1995 | Edmond et al. |
| 5,409,859 A | 4/1995 | Glass et al. |
| 5,477,436 A | 12/1995 | Bertling et al. |
| 5,523,589 A | 6/1996 | Edmond et al. |
| 5,585,648 A | 12/1996 | Tischler |
| 5,628,917 A | 5/1997 | MacDonald et al. |
| 5,661,074 A | 8/1997 | Tischler |
| 5,670,798 A | 9/1997 | Schetzina |
| 5,679,152 A | 10/1997 | Tischler et al. |
| 5,679,965 A | 10/1997 | Schetzina |
| 5,684,309 A | 11/1997 | McIntosh et al. |
| 5,744,829 A | 4/1998 | Murasato et al. |
| 5,766,981 A | 6/1998 | Thornton et al. |
| 5,777,350 A | 7/1998 | Nakamura et al. |

(Continued)

FOREIGN PATENT DOCUMENTS

| | | |
|---|---|---|
| EP | 0881666 A2 | 12/1998 |
| EP | 0 936 682 A | 8/1999 |

(Continued)

OTHER PUBLICATIONS

International Preliminary Report on Patentability Corresponding to International Application No. PCT/US2010/060467; Date of Mailing: Jun. 28, 2012; 6 pages.

(Continued)

*Primary Examiner* — Nathan Ha
(74) *Attorney, Agent, or Firm* — Myers Bigel Sibley & Sajovec, P.A.

(57) ABSTRACT

A semiconductor device may include a doped semiconductor region having a modulated dopant concentration. The doped semiconductor region may be a silicon doped Group III nitride semiconductor region with a dopant concentration of silicon being modulated in the Group III nitride semiconductor region. In addition, a semiconductor active region may be configured to generate light responsive to an electrical signal therethrough. Related methods, devices, and structures are also discussed.

43 Claims, 12 Drawing Sheets

(56) References Cited

U.S. PATENT DOCUMENTS

| | | |
|---|---|---|
| 5,818,072 A | 10/1998 | Schetzina |
| 5,874,747 A | 2/1999 | Redwing et al. |
| 6,046,464 A | 4/2000 | Schetzina |
| 6,060,335 A | 5/2000 | Rennie et al. |
| 6,133,589 A | 10/2000 | Krames et al. |
| 6,150,672 A | 11/2000 | Kaneko |
| 6,153,010 A | 11/2000 | Kiyoku et al. |
| 6,153,894 A | 11/2000 | Udagawa |
| 6,156,581 A | 12/2000 | Vaudo et al. |
| 6,162,656 A | 12/2000 | Kunisato et al. |
| 6,165,812 A | 12/2000 | Ishibashi et al. |
| 6,201,262 B1 | 3/2001 | Edmond et al. |
| 6,238,945 B1 | 5/2001 | Kaneko |
| 6,330,111 B1 | 12/2001 | Myers |
| 6,331,915 B1 | 12/2001 | Myers |
| 6,331,944 B1 | 12/2001 | Monsma et al. |
| 6,337,493 B1 | 1/2002 | Tanizawa et al. |
| 6,372,536 B1 | 4/2002 | Fischer et al. |
| 6,389,051 B1 | 5/2002 | Van de Walle et al. |
| 6,407,407 B1 | 6/2002 | Johnson et al. |
| 6,410,939 B1 | 6/2002 | Koide et al. |
| 6,447,604 B1 | 9/2002 | Flynn et al. |
| 6,452,214 B2 | 9/2002 | Kaneyama et al. |
| 6,459,100 B1 | 10/2002 | Doverspike et al. |
| 6,482,711 B1 | 11/2002 | Nguyen et al. |
| 6,504,179 B1 | 1/2003 | Ellens et al. |
| 6,515,313 B1 | 2/2003 | Ibbetson et al. |
| 6,526,082 B1 | 2/2003 | Corzine et al. |
| 6,576,933 B2 | 6/2003 | Sugawara et al. |
| 6,586,762 B2 | 7/2003 | Kozaki |
| 6,608,330 B1 | 8/2003 | Yameda |
| 6,657,393 B2 | 12/2003 | Natsume |
| 6,664,560 B2 | 12/2003 | Emerson et al. |
| 6,717,185 B2 | 4/2004 | Edmond et al. |
| 6,734,033 B2 | 5/2004 | Emerson et al. |
| 6,734,035 B2 | 5/2004 | Watanabe et al. |
| 6,746,889 B1 | 6/2004 | Eliashevich et al. |
| 6,784,463 B2 | 8/2004 | Camras et al. |
| 6,791,119 B2 | 9/2004 | Slater et al. |
| 6,794,684 B2 | 9/2004 | Slater et al. |
| 6,821,800 B2 | 11/2004 | Koide et al. |
| 6,833,564 B2 | 12/2004 | Shen et al. |
| 6,847,060 B2 | 1/2005 | Welser et al. |
| 6,878,975 B2 | 4/2005 | Hueschen |
| 6,882,051 B2 | 4/2005 | Majumdar et al. |
| 6,891,268 B2 | 5/2005 | Tomiya et al. |
| 6,932,497 B1 | 8/2005 | Huang |
| 6,943,381 B2 | 9/2005 | Gardner et al. |
| 6,949,774 B2 | 9/2005 | Parikh et al. |
| 6,958,497 B2 | 10/2005 | Emerson et al. |
| 7,083,490 B2 | 8/2006 | Mueller et al. |
| 7,087,936 B2 | 8/2006 | Negley |
| 7,194,170 B2 | 3/2007 | Biegelsen |
| 7,214,626 B2 | 5/2007 | Huang |
| 7,279,717 B2 | 10/2007 | Yamada |
| 7,491,626 B2 | 2/2009 | Gaska et al. |
| 7,557,380 B2 | 7/2009 | Haberern et al. |
| 7,612,363 B2 | 11/2009 | Takeda et al. |
| 7,614,759 B2 | 11/2009 | Negley |
| 7,638,811 B2 | 12/2009 | Slater, Jr. |
| 7,646,035 B2 | 1/2010 | Loh et al. |
| 7,718,991 B2 | 5/2010 | Negley |
| 7,722,220 B2 | 5/2010 | Van de Ven |
| 7,754,515 B2 * | 7/2010 | Shimizu et al. ............... 438/47 |
| 7,828,460 B2 | 11/2010 | Van de Ven et al. |
| 7,862,214 B2 | 1/2011 | Trott et al. |
| 7,919,791 B2 | 4/2011 | Flynn et al. |
| 7,959,329 B2 | 6/2011 | Van de Ven |
| 7,999,283 B2 | 8/2011 | Chakraborty et al. |
| 8,008,676 B2 | 8/2011 | Negley et al. |
| 8,011,818 B2 | 9/2011 | Negley |
| 8,029,155 B2 | 10/2011 | Van de Ven et al. |
| 8,033,692 B2 | 10/2011 | Negley et al. |
| 8,049,227 B2 | 11/2011 | Miki et al. |
| 8,096,670 B2 | 1/2012 | Trott et al. |
| 8,123,384 B2 | 2/2012 | Negley et al. |
| 8,258,529 B2 | 9/2012 | Konno et al. |
| 2002/0015013 A1 | 2/2002 | Ragle |
| 2002/0054495 A1 | 5/2002 | Natsume |
| 2002/0125492 A1 | 9/2002 | Shakuda |
| 2003/0006418 A1 | 1/2003 | Emerson et al. |
| 2003/0015708 A1 | 1/2003 | Parikh et al. |
| 2003/0085409 A1 | 5/2003 | Shen et al. |
| 2003/0118066 A1 | 6/2003 | Bour et al. |
| 2003/0218183 A1 | 11/2003 | Micovic et al. |
| 2004/0206966 A1 | 10/2004 | Sugawara et al. |
| 2004/0207313 A1 | 10/2004 | Omoto et al. |
| 2005/0040426 A1 | 2/2005 | Edmond et al. |
| 2005/0056824 A1 | 3/2005 | Bergmann et al. |
| 2005/0117320 A1 | 6/2005 | Leu et al. |
| 2005/0158637 A1 | 7/2005 | Kim et al. |
| 2005/0173692 A1 | 8/2005 | Park et al. |
| 2005/0173728 A1 | 8/2005 | Saxler |
| 2005/0219668 A1 | 10/2005 | Taghizadeh |
| 2005/0224829 A1 | 10/2005 | Negley et al. |
| 2006/0002442 A1 | 1/2006 | Haberern et al. |
| 2006/0046328 A1 | 3/2006 | Raffetto et al. |
| 2006/0081862 A1 | 4/2006 | Chua et al. |
| 2006/0158899 A1 | 7/2006 | Avabe et al. |
| 2006/0186418 A1 | 8/2006 | Edmond et al. |
| 2006/0220046 A1 | 10/2006 | Yu et al. |
| 2006/0231860 A1 | 10/2006 | Mishra et al. |
| 2007/0007558 A1 | 1/2007 | Mazzochette |
| 2007/0018198 A1 | 1/2007 | Brandes et al. |
| 2007/0041101 A1 | 2/2007 | Goosey et al. |
| 2007/0090383 A1 | 4/2007 | Ota et al. |
| 2007/0139923 A1 | 6/2007 | Negley et al. |
| 2007/0170447 A1 | 7/2007 | Negley et al. |
| 2007/0268694 A1 | 11/2007 | Bailey et al. |
| 2007/0279903 A1 | 12/2007 | Negley et al. |
| 2008/0036364 A1 | 2/2008 | Li et al. |
| 2008/0038858 A1 | 2/2008 | Emerson et al. |
| 2008/0084685 A1 | 4/2008 | Van de Ven et al. |
| 2008/0084701 A1 | 4/2008 | Van de Ven et al. |
| 2008/0089053 A1 | 4/2008 | Negley |
| 2008/0112168 A1 | 5/2008 | Pickard et al. |
| 2008/0112170 A1 | 5/2008 | Trott et al. |
| 2008/0130282 A1 | 6/2008 | Negley |
| 2008/0258130 A1 | 10/2008 | Bergmann et al. |
| 2009/0029493 A1 | 1/2009 | Emerson et al. |
| 2009/0072254 A1 | 3/2009 | Chakraborty |
| 2009/0104726 A1 | 4/2009 | Slater, Jr. et al. |
| 2009/0152573 A1 | 6/2009 | Loh et al. |
| 2009/0194775 A1 | 8/2009 | Chakraborty |
| 2009/0231835 A1 | 9/2009 | Roberts et al. |
| 2009/0250716 A1 | 10/2009 | Haberern et al. |
| 2009/0283746 A1 | 11/2009 | Chua et al. |
| 2010/0133508 A1 | 6/2010 | Bergmann et al. |
| 2010/0314608 A1 | 12/2010 | Ahn |

FOREIGN PATENT DOCUMENTS

| | | |
|---|---|---|
| EP | 1063711 A1 | 12/2000 |
| EP | 1189289 A1 | 3/2002 |
| EP | 1313187 A1 | 5/2003 |
| EP | 1 349 202 A | 10/2003 |
| EP | 1 653 255 | 5/2006 |
| EP | 1 681 509 | 7/2006 |
| FR | 2 586 844 | 3/1987 |
| FR | 2 759 188 | 8/1998 |
| FR | 2 814 220 | 3/2002 |
| JP | 62-68257 A | 9/1994 |
| JP | 07-162038 A | 6/1995 |
| JP | 07-176826 A | 7/1995 |
| JP | 08-023124 A | 1/1996 |
| JP | 08-070139 A | 3/1996 |
| JP | 08-162671 A | 6/1996 |
| JP | 08-274414 A | 10/1996 |
| JP | 08-330630 A | 12/1996 |
| JP | 09-148678 A | 6/1997 |
| JP | 09-153642 A | 6/1997 |
| JP | 09-162444 A | 6/1997 |
| JP | 09-219556 A | 8/1997 |
| JP | 9-266326 A | 10/1997 |

(56) References Cited

FOREIGN PATENT DOCUMENTS

| | | |
|---|---|---|
| JP | 9-331116 A | 12/1997 |
| JP | 10-012969 A | 1/1998 |
| JP | 10-041581 A | 2/1998 |
| JP | 10-065271 A | 3/1998 |
| JP | 10-065271 A2 | 3/1998 |
| JP | 10-145000 A | 5/1998 |
| JP | 10-145002 A | 5/1998 |
| JP | 10-335757 A | 12/1998 |
| JP | 11-040850 A | 2/1999 |
| JP | 11-074562 A | 3/1999 |
| JP | 11-186659 A | 7/1999 |
| JP | 11-191638 A | 7/1999 |
| JP | 11-224972 A | 8/1999 |
| JP | 11-238945 A | 8/1999 |
| JP | 11-251684 A | 9/1999 |
| JP | 11-298090 A | 10/1999 |
| JP | 11-330552 | 11/1999 |
| JP | 2000-068594 A | 3/2000 |
| JP | 2000-133883 A | 5/2000 |
| JP | 2000-150956 A | 5/2000 |
| JP | 2000-244072 A | 9/2000 |
| JP | 2001-168471 | 6/2001 |
| JP | 2000-307149 A | 1/2002 |
| JP | 2002-374043 A | 12/2002 |
| JP | 2003-218454 A | 7/2003 |
| JP | 2004-186708 A | 7/2004 |
| KR | 10-2001-0075185 A | 8/2001 |
| WO | WO 98-31055 A1 | 7/1998 |
| WO | WO 98/56043 | 12/1998 |
| WO | WO 99-05728 A1 | 2/1999 |
| WO | WO 99-46822 | 9/1999 |
| WO | WO 00-21143 | 4/2000 |
| WO | WO 00/21144 A2 | 4/2000 |
| WO | WO 00-76004 A1 | 12/2000 |
| WO | WO 02-05399 A1 | 1/2002 |
| WO | WO 02/11212 A | 2/2002 |
| WO | WO 03/044870 | 5/2003 |
| WO | WO 2007/005844 A | 1/2007 |

OTHER PUBLICATIONS

Canadian Office Action Corresponding to Canadian Application No, 2,567,739; Dated: Aug. 28, 2012; 3 Pages.

Asbeck P.M. et al., "Enhancement of Base Conductivity Via the Piezoelectric Effect in AlGaN/BaN HBTs", *Solid State Electronics*, Elsevier Science Publishers, Barking GB, vol. 44, No. 2, Feb. 2000, pp. 211-219, p. 213, left-hand column.

International Search Report Corresponding to International Application No. PCT/US10/60467; Date of Mailing: Feb. 11, 2011; 8 pages.

Jena et al., "Realization of Wide Electron Slabs by Polarization Bulk Doping in Graded III-V Nitride Semiconductor Alloys", *Applied Physics Letters*, vol. 81, No, 23, Dec. 2, 2002, pp. 4395-4397.

Johnson M A L et al., "New UV Light Emitter Based on AlGaN Heterostructures with Graded Electron and Hole Injectors", *Materials Research Society Symposium—Proceedings 2002 Materials Research Society US*, vol. 743, 2002, pp. 481-486, abstract; figure 2.

Rajan et al., "AlGaN/GaN Polarization-Doped Field-Effect Transistor for Microwave Power Applications", *Applied Physics Letters*, vol. 84, No. 9, Mar. 1, 2004, pp. 1591-1593.

Sakai et al., "Experimental Investigation of Dependence of Electrical Characteristics on Device Parameters in Trench MOS Barrier Shottky Diodes", *Proceedings of 1998 International Symposium on Power Semiconductor Devices & ICs*, Kyoto, pp. 293-296, Jun. 1998.

Simon J et al, "Polarization-induced 3-dimensional Electron slabs in Graded AlGaN Layers", *Materials Research Society Symposium—Proceedings 2002 Materials Research Society US*, vol. 892, Nov. 28, 2005, pp. 417-422, abstract, 1 and 4.

Teng et al., "Photoluminescence and Electrical Characteristics of the Two-Dimensional Electron Gas in Si Delata-Doped GaN Layers", *Applied Physics Letters*, vol. 78, No. 12, Mar. 19, 2001, pp. 1688-1690.

Zhang AP et al., "Comparison of GAN P-I-N and Schottky Rectifier Performance" *IEEE Transactions on Electron Devices*, IEEE Inc. New York, US, vol. 48, No. 3, pp. 407-411, Mar. 2001.

Zhao et al., "Growth of Si Delta-Doped GaN by Metalorganic Chemical-Vapor", *Applied Physics Letters*, vol. 77, No. 14, Oct. 2, 2000, pp. 2195-2197.

Korean Notice of Preliminary Rejection Corresponding to Korean Patent Application No. 10-2011-7021897; Foreign Text, 4 Pages, English Translation Thereof, 3 Pages.

Japanese Office Action Corresponding to Japanese Patent Application No. 2007-523569; Mailing Date: Apr. 17, 2012; Foreign Text, 2 Pages, English Translation Thereof, 3 Pages.

American Heritage Dictionary, Second College Edition, 1982, Houghton Mifflin Company, Boston, MA., p. 867, definition of the English language word "On."

Flynn, J.S., et al,, Properties of Delta Doped $Al_{0.25}Ga_{0.75}N$ and GaN Epitaxial Layers, ABSTRACT, Paper #L11.44, Materials Research Society 2002 Fall Symposium, Warrendale, PA, USA.

Kim, Ich., et al., "111-nitride Ultraviolet Light-emitting Diodes with Delta Doping," *Appl. Phys. Lett.*, Jul. 21, 2003, pp. 566-568, vol. 83, No. 3.

Pan, Y.B., et al., "Reduction of Threading Edge Dislocation Density in n-type GaN by Si Delta-Doping," *Journal of Crystal Growth*, Jan. 15, 2006, pp. 255-258, vol. 286, No. 2.

Sciana, B., et al., "Epitaxial Growth and Characterisation of Silicon Delta-Doped GaAs, AlAs and $Al_xGa1-_xAs$," *Cryst. Res. Technol.*, Aug. 10, 2001, pp. 1145-1154, vol. 36.

Wang, L.S., et al., "Effects of Periodic Delta-doping on the Properties of GaN:Si Films Grown on Si (111) Substrates," *Appl. Phys. Lett.*, Dec. 13, 2004, vol. 85, No. 24.

Zang, K., et al., "The Effect of Periodic Silane Burst on the Properties of GaN on Si (111) Substrates," *Singapore-MIT Alliance (SMA)*, Advanced Materials for Micro- and Nano-Systems (AMMNS), File No. AMMNS004.pdf, available in DSpace@MIT on Dec. 9, 2004, issued Jan. 2005.

International Search Report, mailed Nov. 13, 2002, for corresponding application No. PCT/US02/16407.

European Search Report, mailed Feb. 2, 2004, for corresponding application No. EP 03 07 8515.

Partial European Search Report (6 pages), mailed May 28, 2009, for corresponding European Application No. 09157557.1.

International Search Report, mailed Feb. 15, 2006, for corresponding application No. PCT/US2005/022597.

Korean Non-Final Rejection and English Translation (12 pages), faxed Sep. 21, 2008, for corresponding Korean Application No. 10-2003-7012710.

Korean Non-Final Rejection and English Translation (8 pages), mailed Jan. 23, 2009, for corresponding Korean application No. 10-2008-7026427.

\* cited by examiner

SEMICONDUCTOR DEVICE STRUCTURES WITH MODULATED DOPING AND RELATED METHODS

FIELD OF THE INVENTION

This invention relates to semiconductor devices and/or fabrication methods therefore, and more particularly to structures, devices and/or methods which may be used in Group III nitride semiconductor devices.

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent lamp.

Group III nitride based LEDs, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board, or wire bonded. A vertical device (without or without the growth substrate) may have a first terminal solder bonded to a carrier substrate or printed circuit board and a second terminal wire bonded to the carrier substrate or printed circuit board.

One difficulty in fabricating Group III nitride based LEDs on silicon carbide substrates has been the fabrication of high quality and low resistance epitaxial layers for LEDs. A gallium nitride layer (or other Group III nitride layer), for example, may be doped with an n-type dopant such as silicon to increase majority carrier concentration thereof and thereby reduce a forward voltage through a resulting LED. Doping with silicon, however, may increase lattice mismatch between the silicon doped gallium nitride layer and the silicon carbide growth substrate thereby increasing cracks in the gallium nitride layer (or other Group III nitride layer) and/or in epitaxial layers formed thereon. Reduced crystal quality due to increased silicon doping may increase forward voltage drop of the resulting LED and/or otherwise reduce performance. In other words, silicon doping provided to reduce resistance may reduce crystal quality (due to increased cracking) thereby reducing performance.

Accordingly, there continues to exist a need in the art to provide improved epitaxial Group III nitride layers for semiconductor devices such as LEDs, for example, by reducing forward voltage while maintaining and/or improving crystal quality.

SUMMARY

According to some embodiments of the present invention, a semiconductor device may include a doped semiconductor region with a dopant concentration of the doped semiconductor region being modulated over a plurality of intervals. Each interval may include at least one portion having a relatively low dopant concentration and at least one portion having a relatively high dopant concentration that is significantly greater than the relatively low dopant concentration. By way of example, different intervals of the modulation may have the same or different thicknesses, and/or the doped semiconductor region may be a doped Group III nitride semiconductor region.

According to other embodiments of the present invention, a method of forming a semiconductor device may include forming a doped semiconductor region. A dopant concentration of the doped semiconductor region may be modulated over a plurality of intervals. Each interval may include at least one portion having a relatively low dopant concentration and at least one portion having a relatively high dopant concentration that is significantly greater than the relatively low dopant concentration. By way of example, different intervals of the modulation may have the same or different thicknesses, and/or the doped semiconductor region may be a doped Group III nitride semiconductor region.

According to some embodiments of the present invention, a Group III nitride semiconductor device may include a doped Group III nitride semiconductor region wherein a dopant concentration of the Group III nitride semiconductor region is modulated, and a semiconductor active region on the doped Group III nitride semiconductor region. The doped Group III nitride semiconductor region may include a silicon doped Group III nitride semiconductor region, and a dopant concentration of silicon may be modulated in the Group III nitride semiconductor region. Moreover, the semiconductor active region may be configured to generate light responsive to an electrical signal therethrough.

The Group III nitride semiconductor region may include a Group III nitride superlattice, and a pattern of the modulated dopant concentration may be provided through the superlattice. Moreover, a period of the modulated dopant concentration may be greater than a period of the superlattice. The superlattice may include a superlattice pattern of alternating layers having different concentrations of indium.

The Group III nitride semiconductor region may include a GaN layer, and a pattern of the modulated dopant concentration may be provided through the GaN layer. The Group III nitride semiconductor region may also include a Group III nitride superlattice between the GaN layer and the active region.

The modulated dopant concentration may define a repeating pattern of different dopant concentrations with a highest dopant concentration of the repeating pattern being at least 50 percent greater than a lowest dopant concentration of the repeating pattern. A silicon carbide substrate may also be provided on the doped Group III nitride semiconductor region so that the doped Group III nitride semiconductor region is between the silicon carbide substrate and the semiconductor active region, and/or the semiconductor active region may include a quantum well structure. In addition, a semiconductor contact layer may be provided on the semiconductor active region so that the semiconductor active region is between the semiconductor contact layer and the Group III nitride semiconductor region, and the semiconductor contact layer and the doped Group III nitride semiconductor region may have opposite conductivity types.

According to other embodiments of the present invention, a method of forming a Group III nitride semiconductor device may include forming a doped Group III nitride semiconductor region with a dopant concentration of the Group III nitride semiconductor region being modulated, and forming a semiconductor active region on the doped Group III nitride semiconductor region. The doped Group III nitride semiconductor region may include a silicon doped Group III nitride semiconductor region, and a dopant concentration of silicon may be modulated in the Group III nitride semiconductor region. Moreover, the semiconductor active region may be configured to generate light responsive to an electrical signal therethrough.

The Group III nitride semiconductor region may include a Group III nitride superlattice, and a pattern of the modulated dopant concentration may be provided through the superlattice. A period of the modulated dopant concentration is greater than a period of the superlattice. The superlattice may include a superlattice pattern of alternating layers having different concentrations of indium. The Group III nitride semiconductor region may include a GaN layer, and a pattern of the modulated dopant concentration may be provided through the GaN layer. The Group III nitride semiconductor region may include a Group III nitride superlattice between the GaN layer and the active region.

The modulated dopant concentration may define a repeating pattern of different dopant concentrations with a highest dopant concentration of the repeating pattern being at least 50 percent greater than a lowest dopant concentration of the repeating pattern.

Forming the doped Group III nitride semiconductor region may include forming the doped Group III nitride semiconductor region on a silicon carbide substrate so that the doped Group III nitride semiconductor region is between the silicon carbide substrate and the semiconductor active region. For example, each of the doped Group III nitride semiconductor region and the semiconductor active region may be formed by epitaxial deposition on a substantially single crystal silicon carbide substrate so that crystal structures thereof are matched.

The semiconductor active region may include a quantum well structure. In addition, a semiconductor contact layer may be formed on the semiconductor active region so that the semiconductor active region is between the semiconductor contact layer and the Group III nitride semiconductor region, and the semiconductor contact layer and the doped Group III nitride semiconductor region may have opposite conductivity types. The semiconductor active region may be configured to generate light responsive to an electrical signal therethrough.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION

Figure 1:
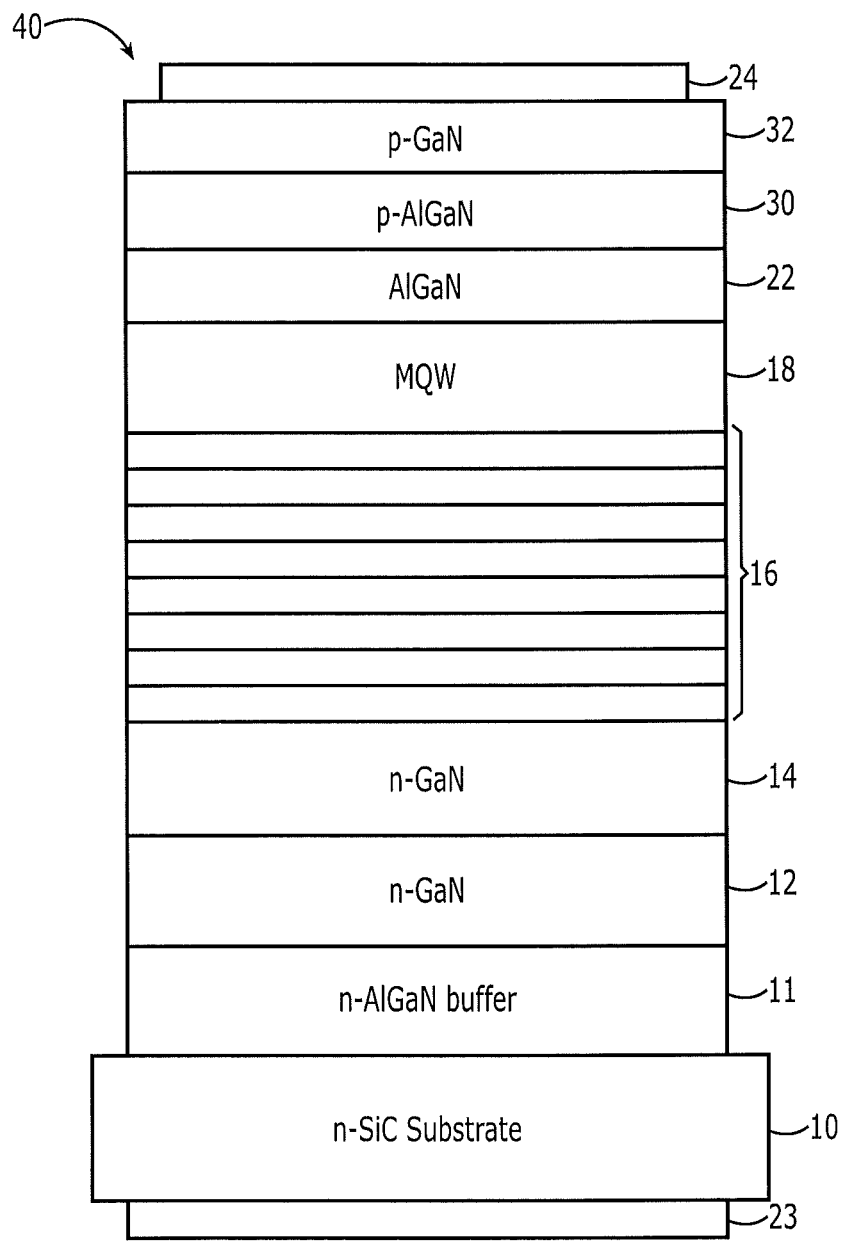
FIG. 1 is a schematic illustration of a Group III nitride light emitting diode incorporating embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be appreciated by those of skill in the art that references to a structure or feature that is disposed "adjacent" another feature may have portions that overlap or underlie the adjacent feature.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree Research, Inc., of Durham, N.C., the assignee of the present invention, and the methods for producing such substrates are set forth in the scientific literature as well as in a number of commonly assigned U.S. patents, including but not limited to U.S. Pat. No. Re. 34,861, U.S. Pat. No. 4,946,547, and U.S. Pat. No. 5,200,022, the disclosures of which are incorporated herein in their entirety by reference.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, and U.S. Pat. No. 5,523,589, the disclosures of which are hereby incorporated herein in their entirety by reference.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be used in connection with structures in which the epitaxial layers have been removed from their original growth substrates and bonded to substitute carrier substrates.

Embodiments of the present invention will be described with reference to FIG. 1 that illustrates a light emitting diode (LED) structure 40. The LED structure 40 of FIG. 1 includes a substrate 10, which may be 4H or 6H n-type silicon carbide. Substrate 10 may also comprise sapphire, bulk gallium nitride (GaN), aluminum nitride (AlN), gallium nitride (GaN), silicon (Si), lithium aluminate, zinc oxide (ZnO), glass, diamond, gallium arsenide, or any other suitable substrate. Also included in the LED structure 40 of FIG. 1 is a layered semiconductor structure comprising gallium nitride-based semiconductor layers on substrate 10. Namely, the LED structure 40 illustrated includes the following layers: a conductive buffer layer 11, a first silicon-doped GaN layer 12, a second silicon doped GaN layer 14, a superlattice 16 comprising alternating layers of silicon-doped GaN and/or InGaN, an active region 18, which may be provided by a multi-quantum well structure, an undoped GaN and/or AlGaN layer 22, an AlGaN layer 30 doped with a p-type impurity, and a GaN contact layer 32, also doped with a p-type impurity. The structure further includes an n-type ohmic contact 23 on the substrate 10 and a p-type ohmic contact 24 on the contact layer 32.

Buffer layer 11 may be n-type AlGaN. Examples of buffer layers between silicon carbide and Group III-nitride materials are provided in U.S. Pat. Nos. 5,393,993 and 5,523,589 and in U.S. Publication No. 2002/0121642 entitled "Vertical Geometry InGaN Light Emitting Diode", each of which is assigned to the assignee of the present invention, the disclosures of which are incorporated by reference as if fully set forth herein. Similarly, embodiments of the present invention may also include structures such as those described in U.S. Pat. No. 6,201,262 entitled "Group III Nitride Photonic Devices on Silicon Carbide Substrates With Conductive Buffer Interlay Structure," the disclosure of which is incorporated herein by reference as if set forth fully herein.

GaN layer 12 may be between about 500 nm and 7000 nm thick inclusive, and according to some embodiments about 4000 nm thick. GaN layer 12 may be doped with silicon at a level of about $5\times10^{17}$ to $7\times10^{18}$ cm$^{-3}$. GaN layer 14 may be between about 10 and 500 Angstroms thick inclusive, and according to some embodiments about 80 Angstroms thick. GaN layer 14 may be doped with silicon at a level of less than about $5 \times 10^{19}$ cm$^{-3}$.

As illustrated in FIG. 1, a superlattice 16 according to embodiments of the present invention includes alternating layers of In$_X$Ga$_{1-X}$N and In$_Y$Ga$_{1-Y}$N, wherein X is between 0 and 1 inclusive and X is not equal to Y. For example, X=0 and the thickness of each of the alternating layers of InGaN is about 5 Angstroms to about 40 Angstroms thick inclusive, and the thickness of each of the alternating layers of GaN is about 5 Angstroms to about 100 Angstroms thick inclusive. In certain embodiments, the GaN layers are about 30 Angstroms thick and the InGaN layers are about 15 Angstroms thick. Superlattice 16 may include from about 5 to about 50 periods (where one period equals one repetition each of the In$_X$Ga$_{1-X}$N and In$_Y$Ga$_{1-Y}$N layers that comprise the superlattice). In one embodiment, superlattice 16 comprises 25 periods. In another embodiment, superlattice 16 comprises 10 periods. The number of periods, however, may be decreased by, for example, increasing the thickness of the respective layers. Thus, for example, doubling the thickness of the layers may be used with half the number of periods. Alternatively, the number and thickness of the periods may be independent of one another.

Superlattice 16 may be doped with an n-type impurity such as silicon at a level of from about $1 \times 10^{17}$ cm$^{-3}$ to about $5 \times 10^{19}$ cm$^{-3}$. Such a dopant concentration may be an actual dopant concentration or average dopant concentration of the layers of superlattice 16. If such dopant concentration is an average dopant concentration, then it may be beneficial to provide doped layers adjacent to superlattice 16 that provide the desired average dopant concentration where doping of the adjacent layers is averaged over the adjacent layers and superlattice 16. By providing superlattice 16 between substrate 10 and active region 18, a better surface may be provided on which to grow InGaN-based active region 18. While not wishing to be bound by any theory of operation, the inventors believe that strain effects in superlattice 16 provide a growth surface that is conducive to the growth of a high-quality InGaN-containing active region. Further, the superlattice is known to influence the operating voltage of the device. Appropriate choice of superlattice thickness and composition parameters can reduce operating voltage and increase optical efficiency.

Superlattice 16 may be grown in an atmosphere of nitrogen or other gas, which enables growth of higher-quality InGaN layers in the structure. By growing a silicon-doped InGaN/GaN superlattice on a silicon-doped GaN layer in a nitrogen atmosphere, a structure having improved crystallinity and conductivity with optimized strain may be realized.

In some embodiments of the present invention, the active region 18 may comprise a single or multi-quantum well structure as well as single or double heterojunction active regions. In some embodiments of the present invention, the active region 18 comprises a multi-quantum well structure that includes multiple InGaN quantum well layers separated by barrier layers (not shown in FIG. 1).

Layer 22 is provided on active region 18 and may be undoped GaN or AlGaN between about 0 and 250 Angstroms thick inclusive. As used herein, an undoped layer/region refers to a not intentionally doped layer/region. Layer 22 may be about 35 Angstroms thick. If layer 22 comprises AlGaN, the aluminum percentage in such layer may be about 10 percent to about 30 percent, and according to some embodiments, the aluminum percentage may be about 24 percent. The level of aluminum in layer 22 may also be graded in a stepwise or continuously decreasing fashion. Layer 22 may be grown at a higher temperature than the growth temperatures in quantum well region 25 in order to improve the crystal quality of layer 22. Additional layers of undoped GaN or AlGaN may be included in the vicinity of layer 22. For example, LED 1 may include an additional layer of undoped AlGaN about 6 Angstroms to about 9 Angstroms thick between the active region 18 and the layer 22.

An AlGaN layer 30 doped with a p-type impurity such as magnesium is provided on layer 22. The AlGaN layer 30 may be between about 0 and 300 Angstroms thick inclusive, and according to some embodiments, the AlGaN layer 30 may be about 150 Angstroms thick. A contact layer 32 of p-type GaN is provided on the layer 30 and may be about 1800 Angstroms thick. Ohmic contacts 24 and 25 are provided on the p-GaN contact layer 32 and the substrate 10, respectively.

Figure 2:
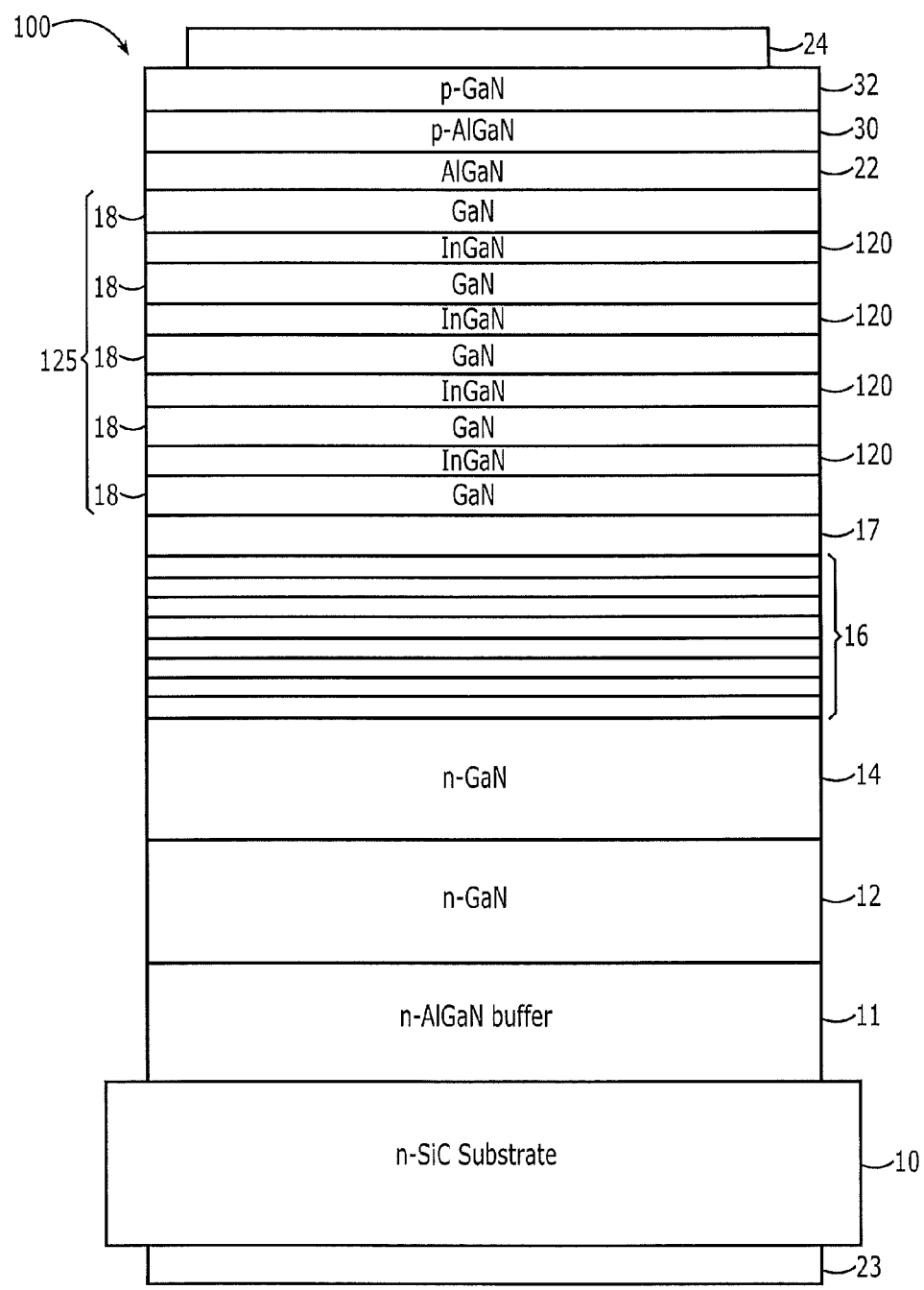
FIG. 2 is a schematic illustration of a Group III nitride light emitting diode incorporating further embodiments of the present invention.

FIG. 2 illustrates further embodiments of the present invention incorporating a multi-quantum well active region. Embodiments of the present invention illustrated in FIG. 2 include a layered semiconductor structure 100 comprising gallium nitride-based semiconductor layers grown on a substrate 10. As described above, the substrate 10 may be silicon carbide (SiC), sapphire, bulk gallium nitride (GaN), aluminum nitride (AlN), gallium nitride (GaN), silicon (Si), lithium gallate (LiGaO$_2$ or LGO), lithium aluminate (LiAlO$_2$), zinc oxide (ZnO), gallium arsenide (GaAs), indium phosphide (InP), glass, diamond, or any other suitable substrate.

As is illustrated in FIG. 2, LEDs according to some embodiments of the present invention may include a conductive buffer layer 11, a first silicon-doped GaN layer 12, a second silicon doped GaN layer 14, a superlattice 16 comprising alternating layers of silicon-doped GaN and/or InGaN, an active region 125 comprising a multi-quantum well structure, an undoped GaN or AlGaN layer 22, an AlGaN layer 30 doped with a p-type impurity, and a GaN contact layer 32, also doped with a p-type impurity. The LEDs may further include an n-type ohmic contact 23 on the substrate 10 and a p-type ohmic contact 24 on the contact layer 32. In embodiments of the present invention where the substrate 10 is sapphire or another insulating, semi-insulating, or resistive substrate, the n-type ohmic contact 23 would be provided on n-type GaN layer 12 and/or n-type GaN layer 14.

As described above with reference to FIG. 1, buffer layer 11 may be n-type AlGaN. Similarly, GaN layer 12 may be between about 500 nm and 7000 nm thick inclusive, and according to some embodiments, GaN layer may be about 4000 nm thick. GaN layer 12 may be doped with silicon at a level of about $5 \times 10^{17}$ to $7 \times 10^{18}$ cm$^{-3}$. GaN layer 14 may be between about 10 Angstroms and 500 Angstroms thick inclusive, and according to some embodiments, GaN layer 14 may be about 80 Angstroms thick. GaN layer 14 may be doped with silicon at a level of less than about $5 \times 10^{19}$ cm$^{-3}$. Superlattice 16 may also be provided as described above with reference to FIG. 1.

The active region 125 comprises a multi-quantum well structure that includes multiple InGaN quantum well layers 120 separated by barrier layers 118. The barrier layers 118 comprise In$_X$Ga$_{1-X}$N where $0 \leq X < 1$. An indium composition of the barrier layers 118 may be less than that of the quantum well layers 120, so that the barrier layers 118 have a higher bandgap than quantum well layers 120. The barrier layers 118 and quantum well layers 120 may be undoped (i.e. not intentionally doped with an impurity atom such as silicon or magnesium). However, it may be desirable to dope the barrier layers 118 with Si at a level of less than $5 \times 10^{19}$ cm$^{-3}$, for example, if ultraviolet emission is desired.

In further embodiments of the present invention, the barrier layers 118 comprise Al$_X$In$_Y$Ga$_{1-X-Y}$N where $0 < X < 1$, $0 \leq Y < 1$ and X+Y≤1. By including aluminum in the crystal of the barrier layers 118, the barrier layers 118 may be lattice-matched to the quantum well layers 120, thereby providing improved crystalline quality in the quantum well layers 120, which may increase the luminescent efficiency of the device.

Figure 3:
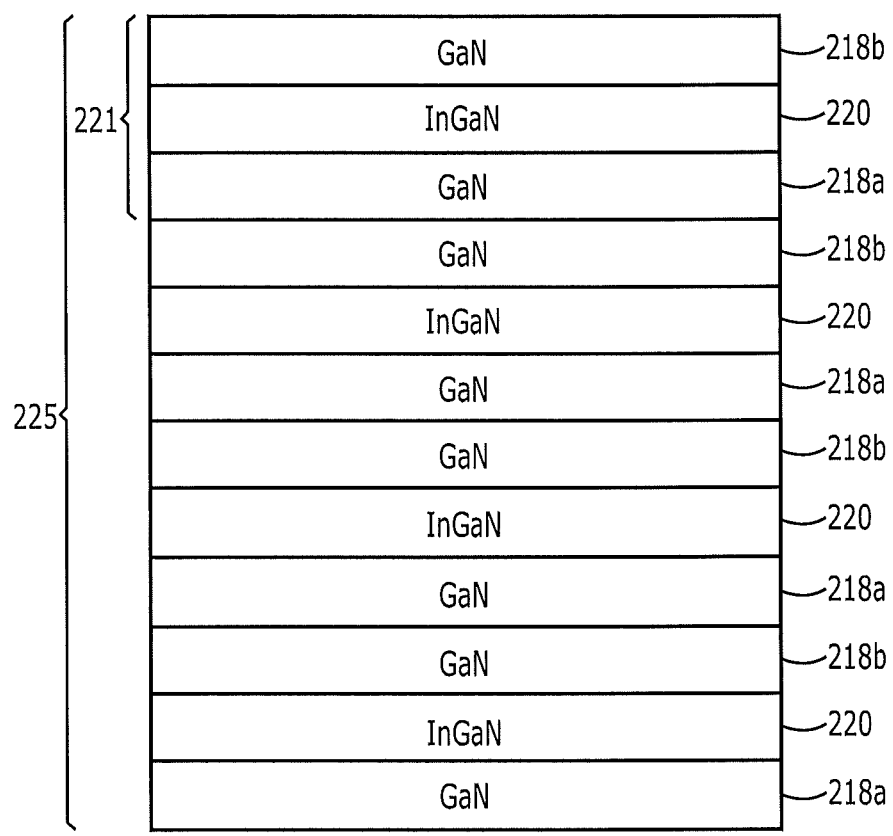
FIG. 3 is a schematic illustration of a quantum well structure and a multi-quantum well structure according to additional embodiments of the present invention.

Referring to FIG. 3, embodiments of the present invention that provide a multi-quantum well structure of a gallium nitride based device are illustrated. The multi-quantum well structure illustrated in FIG. 3 may provide the active region of the LEDs illustrated in FIG. 1 and/or FIG. 2. As seen in FIG. 3, an active region 225 comprises a periodically repeating structure 221 comprising a well support layer 218a having high crystal quality, a quantum well layer 220 and a cap layer 218b that serves as a protective cap layer for the quantum well layer 220. When the structure 221 is grown, the cap layer 218b and the well support layer 218a together form the barrier layer between adjacent quantum wells 220. The high quality well support layer 218a may be grown at a higher temperature than that used to grow the InGaN quantum well layer 220. In some embodiments of the present invention, the well support layer 218a is grown at a slower growth rate than the cap layer 218b. In other embodiments, lower growth rates may be used during the lower temperature growth process and higher growth rates used during the higher temperature growth process. For example, in order to achieve a high quality surface for growing the InGaN quantum well layer 220, the well support layer 218a may be grown at a growth temperature of between about 700 and 900° C. Then, the temperature of the growth chamber is lowered by from about 0 to about 200° C. to permit growth of the high-quality InGaN quantum well layer 220. Then, while the temperature is kept at the lower InGaN growth temperature, the cap layer 218b is grown. In that manner, a multi-quantum well region comprising high quality InGaN layers may be fabricated.

For example, to provide a high quality surface for growing InGaN quantum well 220, well support layer 218a may be grown at a growth temperature in the range of about 750 degrees C. to about 900 degrees C. Then the temperature of the growth chamber may be lowered by about 50 degrees C. to permit growth of a high-quality InGaN quantum well layer. Then, while the temperature is kept at the lower InGaN growth temperature, the cap layer is grown.

Active regions 125 and 225 of FIGS. 2 and 3 may be grown in a nitrogen atmosphere, which may provide increased InGaN crystal quality. Barrier layers 118, the well support layers 218a and/or the cap layers 218b may be between about 50 Angstroms and 400 Angstroms thick inclusive. The combined thickness of corresponding ones of the well support layers 218a and the cap layers 218b may be from about 50 Angstroms to about 400 Angstroms thick inclusive. The barrier layers 118, the well support layers 218a, and/or the cap layers 218b may be greater than about 75 Angstroms thick, and according to some embodiments, greater than about 100 Angstroms thick, greater than about 150 Angstroms thick, or even greater than about 200 Angstroms thick. Also, that the well support layers 218a may be thicker than the cap layers 218b. Thus, the cap layers 218b may be as thin as possible while still reducing the desorption of Indium from or the degradation of the quantum well layers 220. The quantum well layers 120 and 220 may be between about 10 Angstroms and about 50 Angstroms thick inclusive. The quantum well layers 120 and 220 may be greater than 20 Angstroms thick, and according to some embodiments, quantum well layers 120 and 220 may be about 25 Angstroms thick. The thickness and percentage of indium in the quantum well layers 120 and 220 may be varied to produce light having a desired wavelength. Typically, the percentage of indium in quantum well layers 120 and 220 is about 25 percent to about 30 percent, however, depending on the desired wavelength, the percentage of indium has been varied from about 5 percent to about 50 percent.

In some embodiments of the present invention, the bandgap of superlattice 16 exceeds the bandgap of the quantum well layers 120. This may be achieved by adjusting the average percentage of indium in superlattice 16. The thickness (or period) of the superlattice layers and the average Indium percentage of the layers may be chosen such that the bandgap of superlattice 16 is greater than the bandgap of the quantum wells 120. By keeping the bandgap of superlattice 16 higher than the bandgap of the quantum wells 120, unwanted absorption in the device may be reduced and luminescent emission may be increased. The bandgap of superlattice 16 may be from about 2.95 eV to about 3.35 eV. In some embodiments, the bandgap of superlattice 16 is about 3.15 eV.

In additional embodiments of the present invention, the LED structure illustrated in FIG. 2 includes a spacer layer 17 disposed between superlattice 16 and the active region 125. The spacer layer 17 may comprise undoped GaN. The presence of the optional spacer layer 17 between the doped superlattice 16 and active region 125 may deter silicon impurities from becoming incorporated into the active region 125. This, in turn, may improve the material quality of the active region 125 that provides more consistent device performance and better uniformity. Similarly, a spacer layer may also be provided in the LED structure illustrated in FIG. 1 between superlattice 16 and the active region 18.

Returning to FIG. 2, the layer 22 may be provided on the active region 125 and layer 22 may be undoped GaN or AlGaN between about 0 and 250 Angstroms thick inclusive. According to some embodiments, the layer 22 may be about 35 Angstroms thick. If the layer 22 comprises AlGaN, the aluminum percentage in such layer may be about 10 percent to about 30 percent, and according to some embodiments, the aluminum percentage may be about 24 percent. The level of aluminum in the layer 22 may also be graded in a stepwise or continuously decreasing fashion. The layer 22 may be grown at a higher temperature than the growth temperatures in the active region 125 in order to improve the crystal quality of the layer 22. Additional layers of undoped GaN or AlGaN may be included in the vicinity of layer 22. For example, the LED illustrated in FIG. 2 may include an additional layer of undoped AlGaN about 6 Angstroms to about 9 Angstroms thick between the active regions 125 and the layer 22.

An AlGaN layer 30 doped with a p-type impurity such as magnesium is provided on layer 22. The AlGaN layer 30 may be between about 0 and 300 Angstroms thick inclusive, and according to some embodiments, AlGaN layer 30 may be about 150 Angstroms thick. A contact layer 32 of p-type GaN is provided on the layer 30 and may be about 1800 Angstroms thick. Ohmic contacts 24 and 25 are provided on the p-GaN contact layer 32 and the substrate 10, respectively. Ohmic contacts 24 and 25 are provided on the p-GaN contact layer 32 and the substrate 10, respectively.

Figure 4:
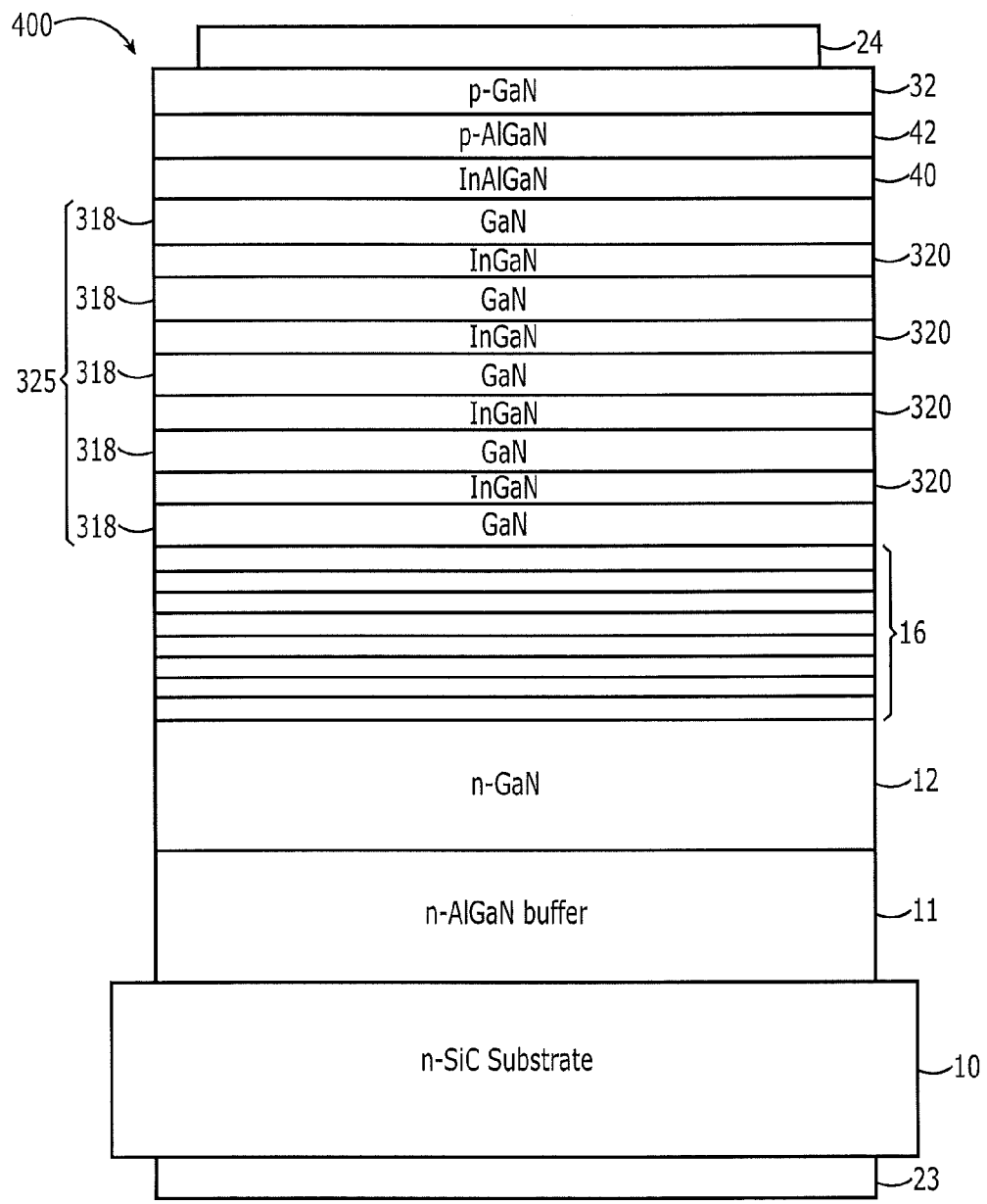
FIG. 4 is a schematic illustration of a Group III nitride light emitting diode incorporating further embodiments of the present invention.

FIG. 4 illustrates further embodiments of the present invention incorporating a Group III-nitride layer incorporating Indium on the active region of the device. For example, an InAlGaN cap structure may be provided. Embodiments of the present invention illustrated in FIG. 4 include a layered semiconductor structure 400 comprising gallium nitride-based semiconductor layers grown on a substrate 10. As described above, the substrate 10 may be silicon carbide (SiC), sapphire, bulk gallium nitride (GaN), aluminum nitride (AlN), gallium nitride (GaN), silicon (Si), lithium aluminate, zinc oxide (ZnO), glass, diamond, gallium arsenide, or any other suitable substrate. In some embodiments of the present invention, the substrate 10 is a SiC substrate having a thickness of from about 50 to about 1500 μm (micrometers) and in some embodiments, a thickness of about 100 μm (micrometers).

As is illustrated in FIG. 4, LEDs according to some embodiments of the present invention may include a conductive buffer layer 11, a first silicon-doped GaN layer 12, a second silicon doped GaN layer 14, a superlattice 16 comprising alternating layers of silicon-doped GaN and/or InGaN, an active region 125 comprising a multi-quantum well structure, an undoped AlInGaN layer 40, an AlGaN layer 30 doped with a p-type impurity, and a GaN contact layer 32, also doped with a p-type impurity. The LEDs may further include an n-type ohmic contact 23 on the substrate 10 and a p-type ohmic contact 24 on the contact layer 32. In embodiments of the present invention where the substrate 10 is sapphire, the n-type ohmic contact 23 would be provided on n-type GaN layer 12 and/or n-type GaN layer 14.

As described above with reference to FIGS. 1 and 2, the buffer layer 11 may be n-type AlGaN. For example, the buffer layer 11 may be AlGaN doped with Si and having a thickness of from about 100 Angstroms to about 10,000 Angstroms. In certain embodiments the thickness is about 1500 Angstroms. The GaN layer 12 may be doped with Si and may have a thickness of from about 5000 Angstroms to 50,000 Angstroms thick inclusive and, in some embodiments, is about 18,000 Angstroms thick. The GaN layer 12 may be doped with silicon at a level of about $5 \times 10^{17}$ to $7 \times 10^{18}$ cm$^{-3}$. Superlattice 16 may also be provided as described above with reference to FIG. 1. For example, superlattice 16 may have from 3 to 35 periods of InGaN/GaN. The thickness of the periods may be from about 30 Angstroms to about 100 Angstroms. In some embodiments of the present invention, twenty five (25) periods of InGaN/GaN are provided with the thickness of a period of layers being about 70 Angstroms and the thickness of the GaN or InGaN layer being about 15 Angstroms with the other layer making up the remainder.

The active region 325 may include a multi-quantum well structure that includes multiple InGaN quantum well layers 320 separated by barrier layers 318. The barrier layers 318 comprise In$_X$Ga$_{1-X}$N where 0≤X<1. The indium composition of the barrier layers 318 may be less than that of the quantum well layers 320, so that the barrier layers 318 have a higher bandgap than quantum well layers 320. The barrier layers 318 and quantum well layers 320 may be undoped (i.e. not intentionally doped with an impurity atom such as silicon or magnesium). However, it may be desirable to dope the barrier layers 318 with Si at a level of less than $5 \times 10^{19}$ cm$^{-3}$, for example, if ultraviolet emission is desired.

In further embodiments of the present invention, the barrier layers 318 comprise Al$_X$In$_Y$Ga$_{1-X-Y}$N where 0<X<1, 0≤Y<1 and X+Y≤1. By including aluminum in the crystal of the barrier layers 318, the barrier layers 318 may be lattice-matched to the quantum well layers 320, thereby allowing improved crystalline quality in the quantum well layers 320, which can increase the luminescent efficiency of the device.

The active region 325 may also be provided as illustrated in FIG. 3 and described above with reference to FIGS. 1 through 3. In some embodiments of the present invention, the active region 325 includes 3 or more quantum wells and in certain embodiments, eight (8) quantum wells are provided. The thickness of the quantum well structures may be from about 30 Angstroms to about 250 Angstroms. In some embodiments of the present invention, the thickness of a quantum well structure may be about 120 Angstroms with the thickness of the well layer being about 25 Angstroms.

The LED structure illustrated in FIG. 4 may also include a spacer layer disposed between superlattice 16 and the active region 325 as described above.

Returning to FIG. 4, a Group III-nitride capping layer 40 that includes Indium may be provided on the active region 325 and, more specifically, on the quantum well 320 of the active region 325. The Group III-nitride capping layer 40 may include InAlGaN between about 10 Angstroms and 320 Angstroms thick inclusive. The capping layer 40 may be of uniform composition, multiple layers of different compositions and/or graded composition. In some embodiments of the present invention, the capping layer 40 includes a first capping layer having a composition of In$_x$Al$_y$Ga$_{1-x-y}$N, where 0<x≤0.2 and 0≤y≤0.4 and having a thickness of from about 10 Angstroms to about 200 Angstroms and a second capping layer having a composition of In$_w$Al$_z$Ga$_{1-w-z}$N, where 0<w≤0.2 and y≤z<1 and having a thickness of from about 10 Angstroms to about 120 Angstroms. In certain embodiments of the present invention, the first capping layer has a thickness of about 80 Angstroms, x=0.1 and y=0.25 and the second capping layer has a thickness of about 30 Angstroms, w=0.05 and z=0.55. The capping layer 40 may be grown at a higher temperature than the growth temperatures in the active region 325 in order to improve the crystal quality of the layer 40. Additional layers of undoped GaN or AlGaN may be included in the vicinity of layer 40. For example, a thin layer of GaN may be provided between a last quantum well layer and the capping layer 40. The capping layer 40 that includes indium may be more closely lattice matched to the quantum wells of the active region 325 and may provide a transition from the lattice structure of the active region 325 to the lattice structure of the p-type layers. Such a structure may result in increased brightness of the device.

An AlGaN hole injection layer 42 doped with a p-type impurity such as magnesium is provided on the capping layer 40. The AlGaN layer 42 may be between about 50 Angstroms and 2500 Angstroms thick inclusive and, in some embodiments, is about 150 Angstroms thick. The AlGaN layer 42 may be of the composition of Al$_x$Ga$_{1-x}$N, where 0≤x≤0.4. In some embodiments of the present invention, x=0.23 for the AlGaN layer 42. The AlGaN layer 42 may be doped with Mg. In some embodiments of the present invention, the layer 42 may also include Indium.

A contact layer 32 of p-type GaN is provided on the layer 42 and may be from about 250 Angstroms to abut 10,000 Angstroms thick and in some embodiments, about 1500 Angstroms thick. In some embodiments, the contact layer 32 may also include Indium. Ohmic contacts 24 and 25 are provided on the p-GaN contact layer 32 and the substrate 10, respectively. Ohmic contacts 24 and 25 are provided on the p-GaN contact layer 32 and the substrate 10, respectively.

In some embodiments of the present invention, the indium containing capping layer 40 may be provided in light emitting devices as described, for example, in United States Provisional Patent Application Serial No. 2006/0046328 entitled "ULTRA-THIN OHMIC CONTACTS FOR P-TYPE NITRIDE LIGHT EMITTING DEVICES AND METHODS OF FORMING", U.S. Pat. No. 7,557,380 entitled "LIGHT EMITTING DEVICES HAVING A REFLECTIVE BOND PAD AND METHODS OF FABRICATING LIGHT EMITTING DEVICES HAVING REFLECTIVE BOND PADS", U.S. Pat. No. 6,664,560, United States Patent Publication No. 2006/0002442 entitled "LIGHT EMITTING DEVICES HAVING CURRENT BLOCKING STRUCTURES AND METHODS OF FABRICATING LIGHT EMITTING DEVICES HAVING CURRENT BLOCKING STRUCTURES", U.S. Patent Publication No. 2002/0123164 entitled "LIGHT EMITTING DIODES INCLUDING SUBSTRATE MODIFICATIONS FOR LIGHT EXTRACTION AND MANUFACTURING METHODS THEREFOR" and/or in U.S. Patent Publication No. 2003/0168663 entitled "REFLECTIVE OHMIC CONTACTS FOR SILICON CARBIDE INCLUDING A LAYER CONSISTING ESSENTIALLY OF NICKEL, METHODS OF FABRICATING SAME, AND LIGHT EMITTING DEVICES INCLUDING THE SAME," the disclosures of which are incorporated herein as if set forth in their entirety.

While embodiments of the present invention have been described with multiple quantum wells, the benefits from the teachings of the present invention may also be achieved in single quantum well structures. Thus, for example, a light emitting diode may be provided with a single occurrence of the structure 221 of FIG. 3 as the active region of the device. Thus, while different numbers of quantum wells may be used according to embodiments of the present invention, the number of quantum wells will typically range from 1 to 10 quantum wells.

LED structures discussed above with respect to FIGS. 1-4 are also discussed in U.S. Pat. No. 6,958,497 entitled "Group III Nitride Based Light Emitting Diode Structures With A Quantum Well And Superlattice, Group III Nitride Based Quantum Well Structures And Group III Nitride Based Superlattice Structures" and U.S. Patent Publication No. 2005/0056824 entitled "Group III Nitride Based Quantum Well Light Emitting Device Structures With An Indium Containing Capping Structure", both assigned to Cree, Inc., the assignee of the present application. The disclosures of both of the above referenced U.S. patent documents are hereby incorporated herein in their entirety by reference.

Figure 5:
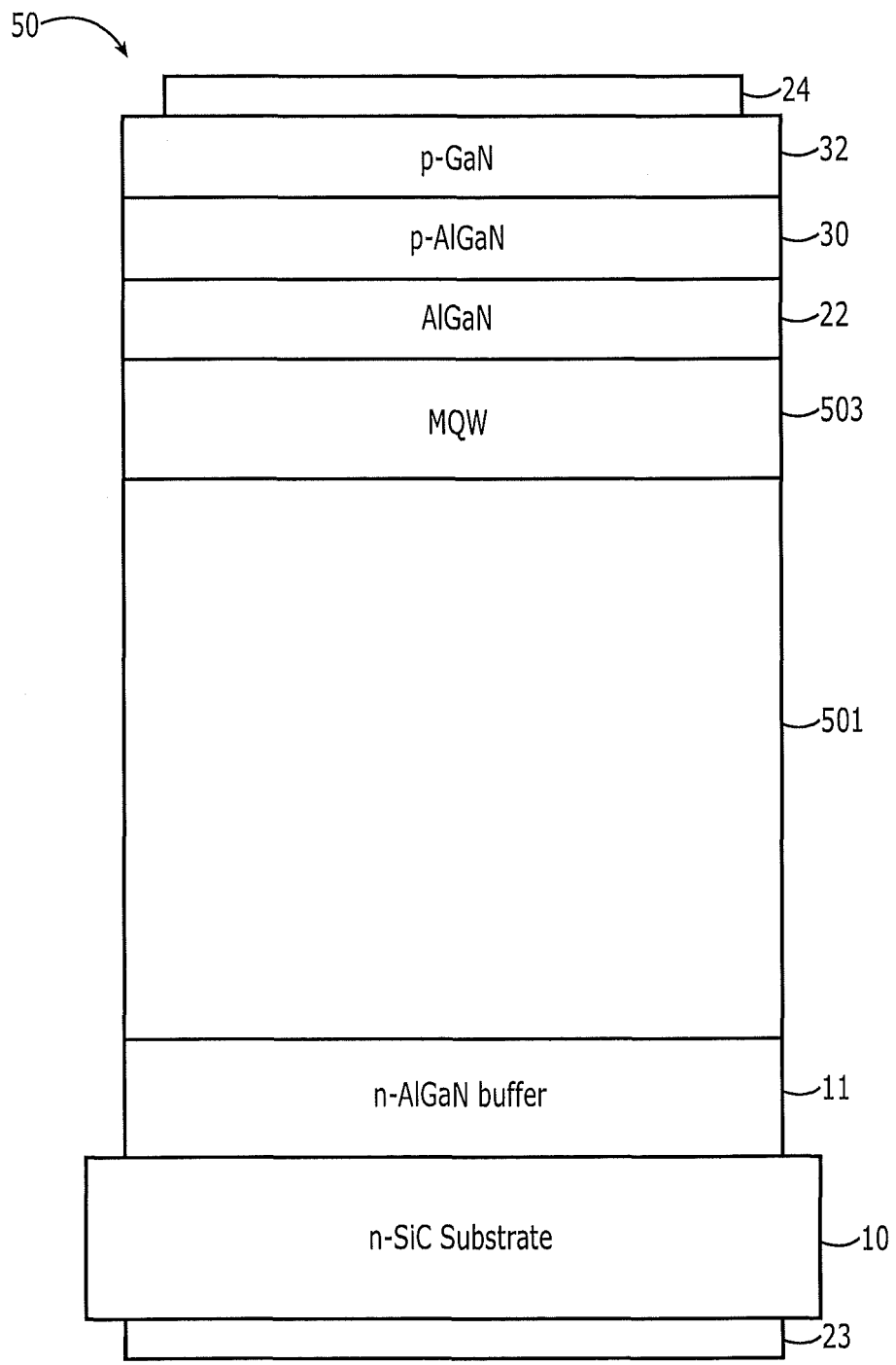
FIG. 5 is a schematic illustration of a Group III nitride light emitting diode including a base layer structure according to still further embodiments of the present invention.

According to additional embodiments of the present invention, a Group III nitride based light emitting diode 50 may include a Group III nitride semiconductor base region 501 with modulated silicon doping and an active region 503, as shown in FIG. 5. LED 50, for example, may include an n-type silicon carbide substrate 10, a conductive buffer layer 11, an undoped layer 22, a p-type AlGaN layer 30, a p-GaN contact layer 32, and ohmic contacts 23 and 24, as discussed above with regard to FIG. 1. P—GaN contact layer 32, for example, may be grown using ammonia as a source gas together with a carrier gas(es) such as hydrogen ($H_2$), nitrogen ($N_2$), an inert gas(es), and/or mixtures thereof. Moreover, P—GaN layer 32 may be subjected to a post deposition anneal at a temperature of at least about 750 degrees C. in an atmosphere including nitrogen ($N_2$), an inert gas(es), oxygen ($O_2$), and/or mixtures thereof.

Moreover, active region 503 may be provided as discussed above with respect to active region 18 of FIG. 1, with respect to active region 125 of FIG. 2, with respect to active region 225 of FIG. 3, and/or with respect to active region 325 of FIG. 4. In addition, a spacer layer may be provided between active region 503 and base region 501 as discussed above with respect to spacer layer 17 of FIG. 2, and/or a capping layer may be provided in addition to or instead of undoped layer 22 as discussed above with respect to capping layer 40 of FIG. 4.

The barrier layers and/or quantum well layers of active region 503 may be undoped (i.e. not intentionally doped with an impurity atom such as silicon or magnesium). A multi-quantum well structure of active region 503 may thus be free of modulated silicon doping.

Group III nitride semiconductor base region 501 or layers may include a GaN layer or layers and/or a superlattice as discussed above with respect to GaN layer 12 and/or superlattice 16 of FIGS. 1, 2, and 4. In addition, base region 501 may include a second (relatively thin) n-GaN layer as discussed above with respect to n-GaN layer 14 of FIGS. 1 and 2, and/or base region 501 may include additional layers of other Group III nitride semiconductor materials such as AlGaN, InGaN, AlInGaN, InGaN, InN, AlN, etc. Moreover, Group III nitride semiconductor base region 501 may include modulated silicon doping through a portion or portions thereof, or throughout an entire thickness thereof.

According to some embodiments of the present invention, a dopant concentration of at least a portion of base region 501 layer may be modulated over a plurality of intervals with each interval including at least one portion having a relatively low dopant concentration and at least one portion having a relatively high dopant concentration that is significantly greater than the relatively low dopant concentration. For example, first and second adjacent intervals of modulated dopant concentration may be provided. A first portion of the first interval may have a first relatively low dopant concentration and a second portion of the first interval may have a first relatively high dopant concentration. A first portion of the second interval may have a second relatively low dopant concentration and a second portion of the second interval may have a second relatively high dopant concentration. The first relatively high dopant concentration may be greater than the first and second relatively low dopant concentrations, and the second relatively low dopant concentration may be less than the first and second relatively high dopant concentrations. Moreover, the second portion of the first interval may be between the first portions of the first and second intervals, and the first portion of the second interval may be between the second portions of the first and second intervals. According to some embodiments, the first and second relatively high dopant concentrations may be different, and/or the first and second relatively low dopant concentrations may be different. According to other embodiments, the first and second relatively high dopant concentrations may be the same, and/or the first and second relatively low dopant concentrations may be the same. Moreover, different intervals of the modulation may have the same or different thicknesses.

According to some embodiments, modulated silicon doping may be characterized by a repeating pattern of different silicon dopant concentrations, and a period of the modulated silicon doping may be defined as a thickness defining a smallest unit of the pattern. With a repeating pattern, for example, an interval as defined above may define a period of the pattern. Modulated silicon doping according to some embodiments of the present invention, for example, may have a period in the range of at least about 50 Angstroms or at least about 100 Angstroms. By way of example, a period of modulated silicon doping may by in the range of about 50 Angstroms to about 5000 Angstroms, or in the range of about 100 Angstroms to about 2500 Angstroms. While periodic and/or repeating patterns are discussed herein by way of example, modulation doping according to some embodiments of the present invention does not require either repetition or periodicity.

By way of example, alternating layers of two different silicon dopant concentrations may define a modulated silicon doping pattern for base region 501, and a combined thickness of two such adjacent layers may define a period of the modulated silicon doping pattern. Each layer of the pattern may have a thickness of less than about 1 micrometer and greater than about 50 Angstroms, and according to some embodiments, less than about 2000 Angstroms, less than about 1500 Angstroms, less than about 1000 Angstroms, or even less than about 500 Angstroms. According to some embodiments of the present invention, each layer of the pattern may have a thickness in the range of about 50 Angstroms to about 5000 Angstroms, in the range of about 100 Angstroms to about 2500

Figure 6:
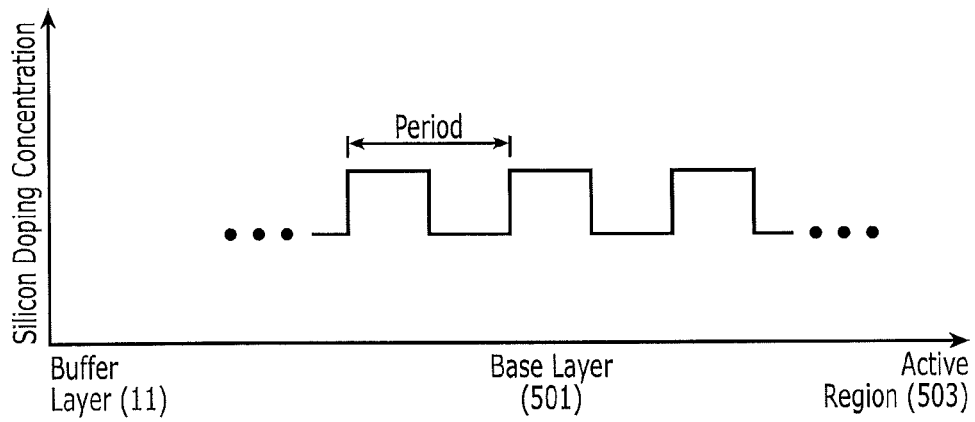
FIGS. 6-18 are graphical illustrations of modulated silicon dopant patterns according to embodiments of the present invention.

Angstroms, or in the range of about 500 Angstroms to about 800 Angstroms. FIG. 6 is a graph illustrating silicon dopant concentrations for a bilayer modulated silicon doping pattern through base region 501 between buffer layer 11 and active region 503 according to some embodiments of the present invention.

While a square pattern (or step function) is shown by way of example, a more gradual gradient may occur between layers of relatively high and low silicon dopant concentration due to intentional and/or unintentional grading during deposition and/or due to subsequent diffusion. By way of example, each layer of low dopant concentration may have a thickness of about 700 Angstroms (grown while maintaining a low flow rate of a silicon source gas such as silane/$SiH_4$), and each layer of high dopant concentration may have a thickness of about 700 Angstroms (grown while maintaining a high flow rate of a silicon source gas such as silane/$SiH_4$). Moreover, a 50 Angstrom graded transition layer may be provided at each transition from a layer of low dopant concentration to a layer of high dopant concentration by ramping (linearly increasing) the silicon source gas (e.g., silane/$SiH_4$) flow from the low flow rate (used to grow the layer of low dopant concentration) to the high flow rate (used to grow the layer of high dopant concentration). In addition, a 50 Angstrom graded transition layer may be provided at each transition from a layer of high dopant concentration to a layer of low dopant concentration by ramping (linearly decreasing) the silicon source gas (e.g., silane/$SiH_4$) flow from the high flow rate (used to grow the layer of high dopant concentration) to the low flow rate (used to grow the layer of low dopant concentration). Adjacent layers of relatively high and low silicon dopant concentration (each about 700 Angstroms thick) may thus be separated by a graded transition layer (about 50 Angstroms thick) to provide a period of about 1500 Angstroms.

According to some embodiments, layers of relatively high silicon dopant concentration of FIG. 6 may have a silicon dopant concentration that is at least about 1.5 times (50 percent) greater than layers of relatively low silicon dopant concentration, and according to some embodiments, at least about 2 times (100 percent) greater, at least about 3 times (200 percent) greater, at least about 10 times (one order of magnitude) greater, at least about 100 times (two orders of magnitude) greater, at least about 1,000 times (three orders of magnitude) greater, or even at least about 10,000 times (four orders of magnitude) greater. Moreover, layers of different silicon dopant concentrations may have approximately the same thicknesses. For example, layers of relatively low silicon dopant concentration may have a thickness of about 500 Angstroms and a silicon dopant concentration in the range of nominally undoped up to about $7\times10^{18}$ $cm^{-3}$, and according to some embodiments, in the range of at least about $1\times10^{17}$ $cm^{-3}$ to about $7\times10^{18}$ $cm^{-3}$, or in the range of about $4\times10^{18}$ $cm^{-3}$ to about $6\times10^{18}$ $cm^{-3}$. Layers of relatively high silicon dopant concentration may have a thickness of about 500 Angstroms and a silicon dopant concentration in the range of about $8\times10^{18}$ $cm^{-3}$ to about $1\times10^{22}$ $cm^{-3}$, and according to some embodiments, in the range of about $8\times10^{18}$ $cm^{-3}$ to about $2\times10^{19}$ $cm^{-3}$. According to some embodiments of the present invention, layers of relatively low silicon dopant concentration may have a dopant concentration of about $6\times10^{18}$ $cm^{-3}$, and layers of relatively high silicon dopant concentration may have a dopant concentration of about $1.2\times10^{19}$ $cm^{-3}$.

While FIG. 6 shows that layers of relatively high and low silicon dopant concentration may have approximately the same thicknesses, thicknesses of layers of relatively high and low silicon dopant concentrations may be significantly different. According to some embodiments of the present invention, layers of relatively low silicon dopant concentration may be significantly thicker than layers of relatively high silicon dopant concentration. For example, layers of relatively low silicon dopant concentration may be at least 2 times thicker than layers of relatively high silicon dopant concentration (so that a layer of relatively high silicon dopant concentration makes up no more that about 33 percent of a period), and according to some embodiments, at least 4 times greater (so that a layer of relatively high silicon dopant concentration makes up no more that about 20 percent of a period). Moreover, layers of FIG. 6 may define a period in the range of at least about 50 Angstroms or at least about 100 Angstroms. By way of example, a period of modulated silicon doping may by in the range of about 50 Angstroms to about 5000 Angstroms, or in the range of about 100 Angstroms to about 2500 Angstroms.

Figure 7:
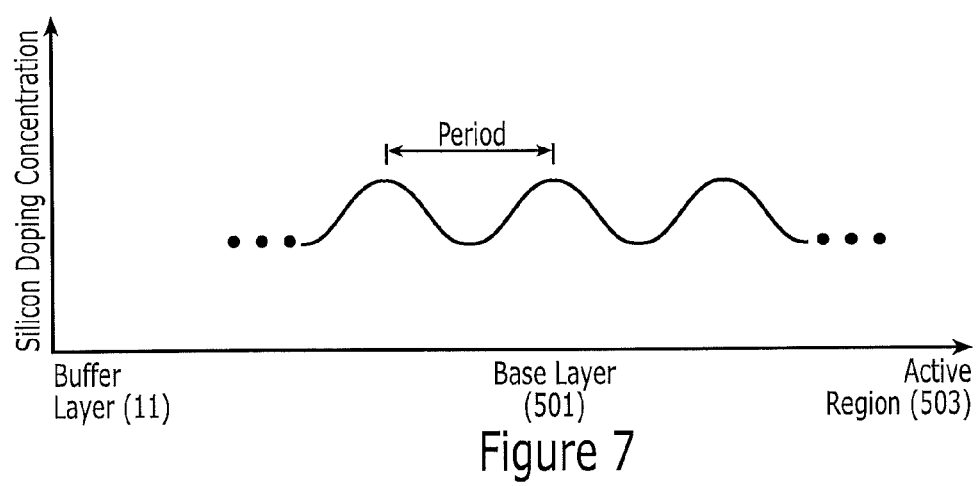
Figure 8:
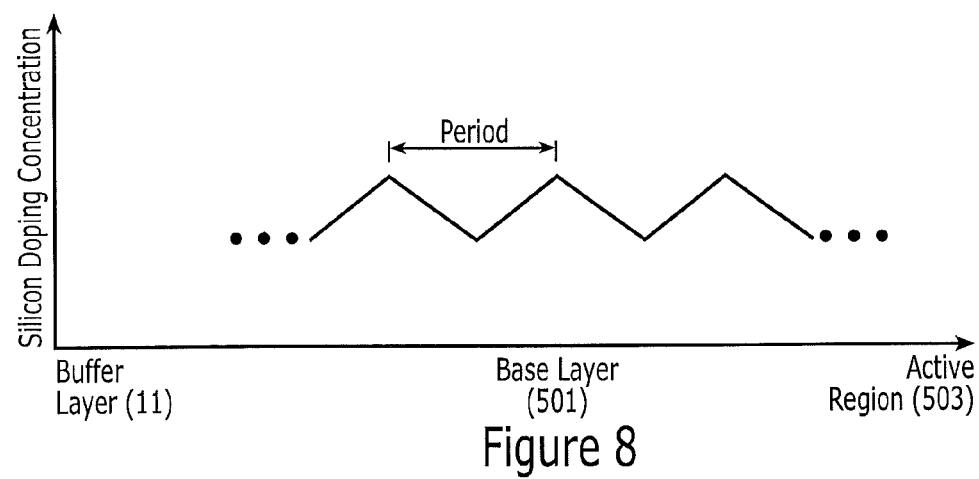
Figure 9:
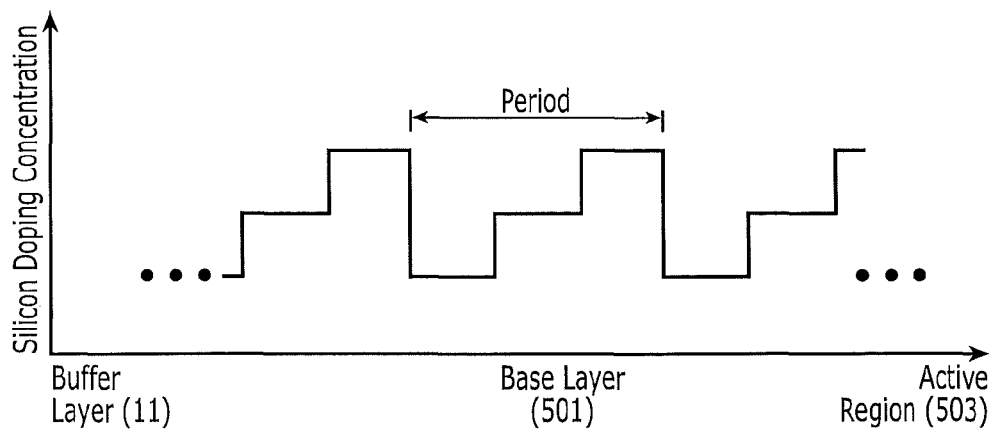
Figure 10:
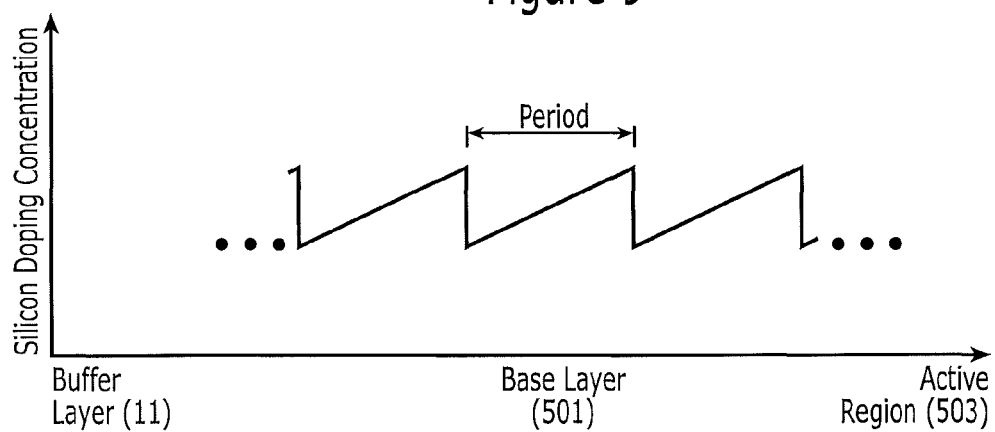

According to other embodiments of the present invention, variations of silicon doping through base region 501 may define patterns other than the square pattern (or step function) illustrated in FIG. 6. As shown in FIG. 7, modulated silicon doping through base region 501, for example, may define a sinusoidal pattern (sine function) of modulated silicon doping as shown in FIG. 7, or a triangular pattern (triangular function) of modulated silicon doping as shown in FIG. 8. Moreover, embodiments of the present invention may be implemented with patterns having more than two different silicon dopant concentrations and/or with non-symmetric patterns. For example, a three step pattern (step function) may be provided with each period including three layers of different silicon dopant concentrations as shown in FIG. 9, and/or a saw tooth pattern (saw tooth function) of silicon dopant concentrations may be provided as shown in FIG. 10.

Figure 11:
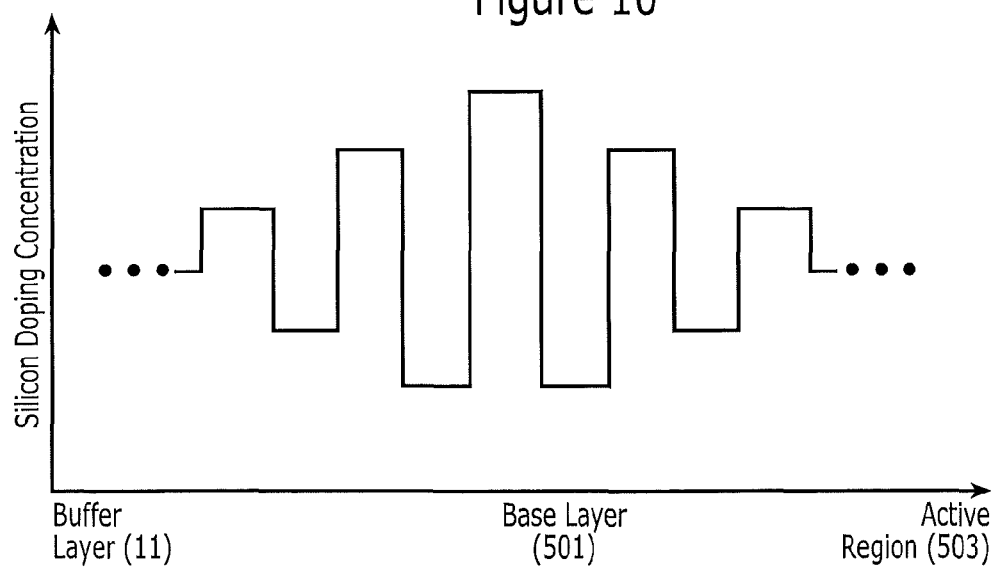
Figure 12:
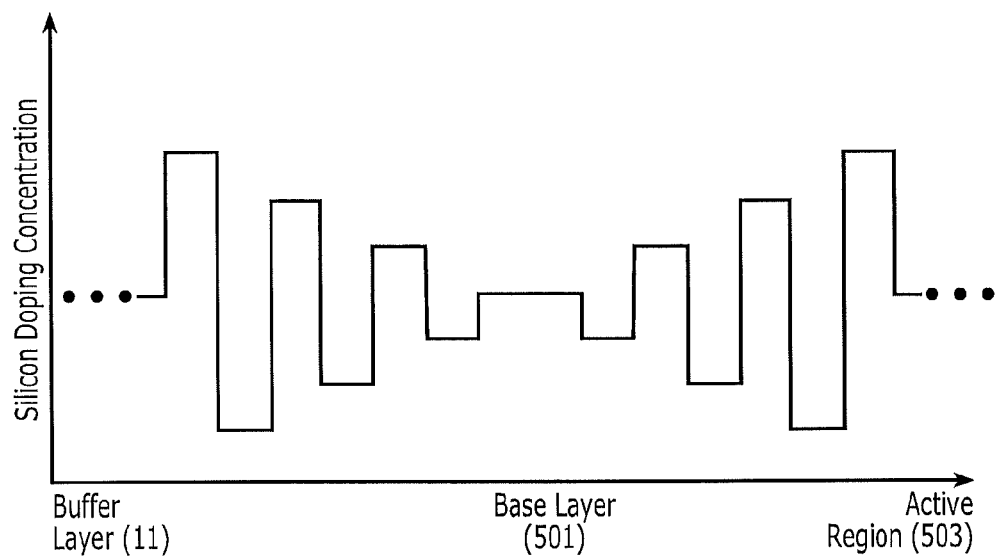
Figure 13:
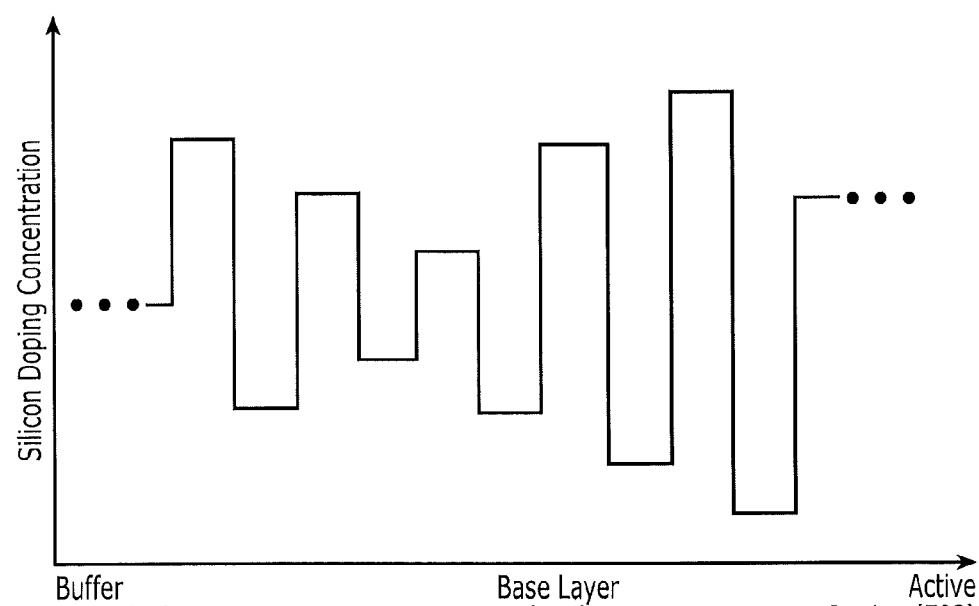
Figure 14:
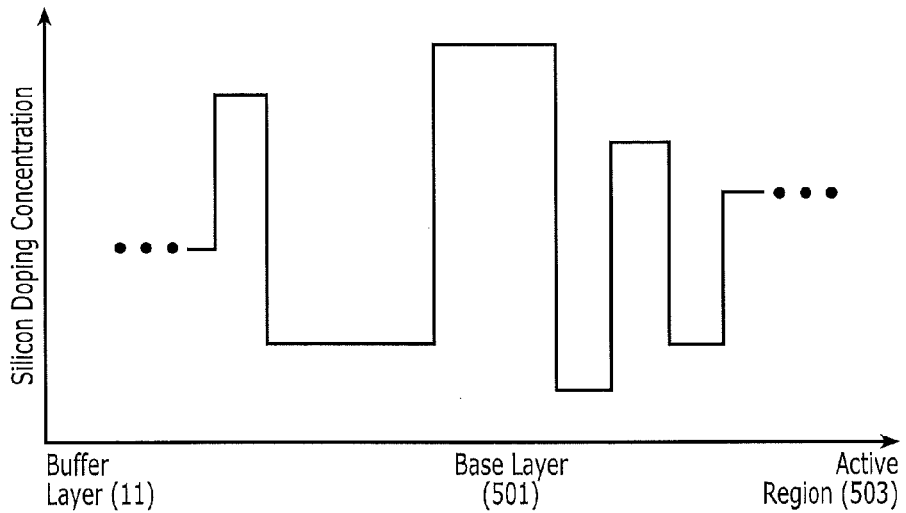

Additional patterns of silicon doping are illustrated in FIGS. 11-17. As shown in FIG. 11, modulated silicon doping through base region 501 may be provided according to a step function with different amplitudes of high and low silicon doping (above and below an average silicon doping) that increase and then decrease symmetrically. As shown in FIG. 12, modulated silicon doping through base region 501 may be provided according to a step function with different amplitudes of high and low silicon doping (above and below an average silicon doping) that decrease and then increase symmetrically. As shown in FIG. 13, modulated silicon doping through base region 501 may be provided according to a step function with different amplitudes of high and low silicon doping (above and below an average silicon doping) that vary without symmetry and/or without a repeating pattern. While thicknesses of the regions/layers of high and low silicon may be the same as shown in FIGS. 11-13, thickness may vary according to other embodiments of the present invention. As shown in FIG. 14, for example, modulated silicon doping through base region 501 may be provided according to a step function with different amplitudes of high and low silicon doping (above and below an average silicon doping) and different thickness that vary without symmetry and/or without a repeating pattern.

Figure 15:
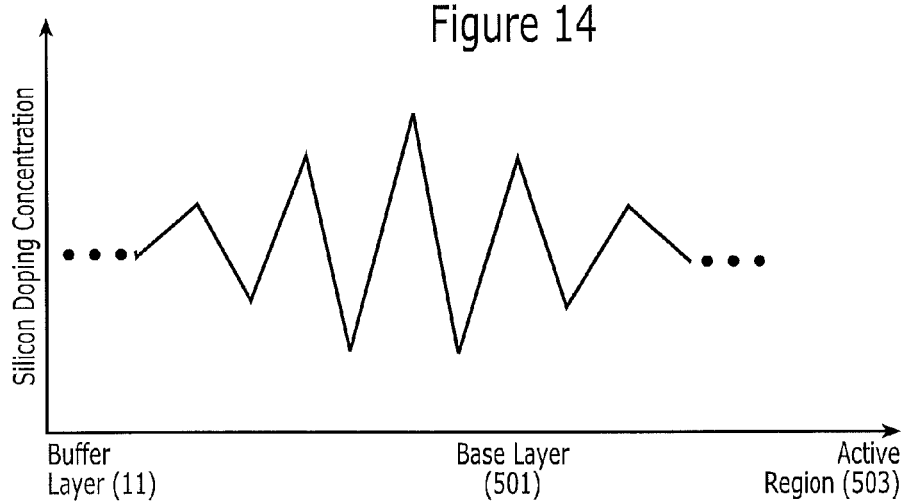
Figure 16:
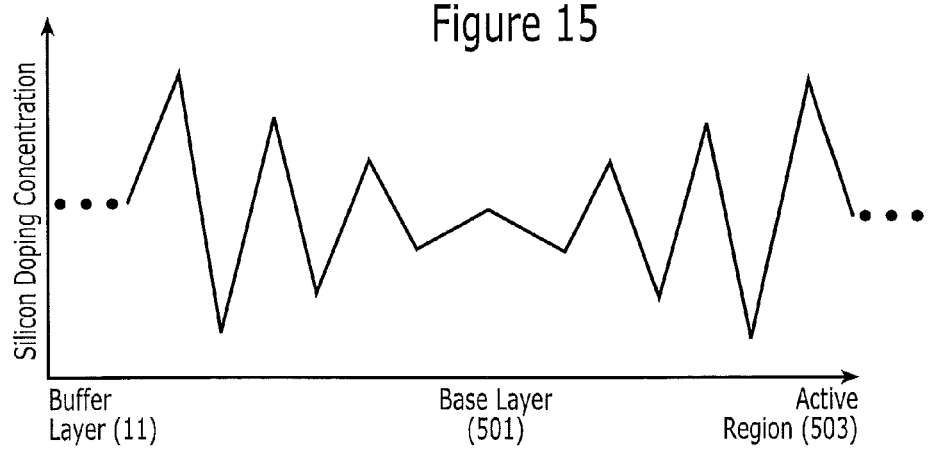

As shown in FIG. 15, modulated silicon doping through base region 501 may be provided according to a graded function with different amplitudes of high and low silicon doping (above and below an average silicon doping) that increase and then decrease symmetrically (analogous to the step function of FIG. 11). As shown in FIG. 12, modulated silicon doping through base region 501 may be provided according to a graded function with different amplitudes of high and low silicon doping (above and below an average silicon doping) that decrease and then increase symmetrically (analogous to the step function of FIG. 12). Modulated silicon doping through base layer may also be provided according to graded functions with different amplitudes of high and low silicon doping (above and below an average silicon doping) that vary without symmetry and/or without a repeating pattern with same or different thicknesses (analogous to the step functions of FIGS. 13 and/or 14). Similarly, sinusoidal functions may be provided with varying amplitudes and/or periods analogous to the step and graded functions of FIGS. 11-16.

Figure 17:
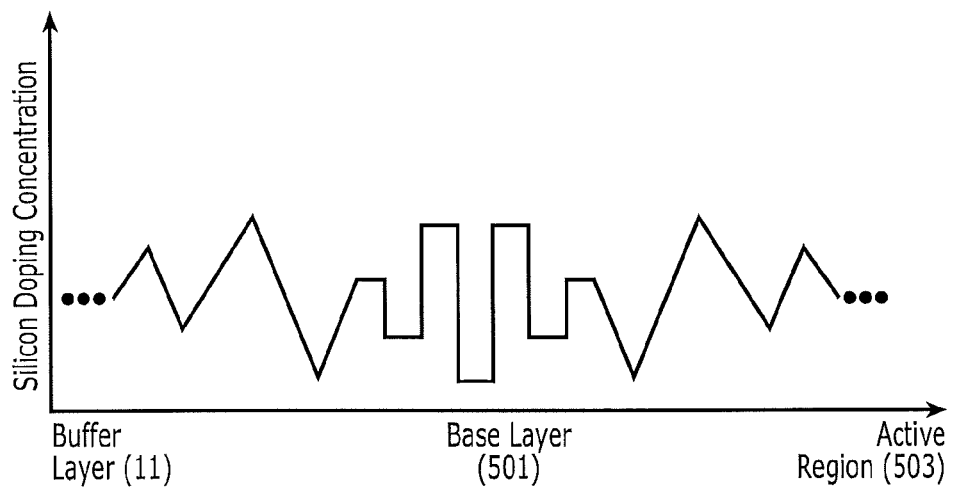

According to additional embodiments of the present invention, modulated silicon doping may combine step and graded functions as shown, for example, in FIG. 17. As shown, step function portions of modulation may be symmetric and/or graded function portions of modulation may be symmetric on opposite sides of the step function portion. According to other embodiments, step function portions may be symmetric on opposite sides of a graded function portion. According to other embodiments, graded and/or step functions may be asymmetric.

In each of the patterns of FIGS. 6-17, a highest silicon doping concentration of the pattern may be at least about at least about 1.5 times (50 percent) greater than a lowest silicon dopant concentration of the pattern, and according to some embodiments, at least about 2 times (100 percent) greater, at least about 3 times (200 percent) greater, at least about 10 times (one order of magnitude) greater, at least about 100 times (two orders of magnitude) greater, at least about 1,000 times (three orders of magnitude) greater, or even at least about 10,000 times (four orders of magnitude) greater. For example, a lowest silicon dopant concentration may be in the range of nominally undoped up to about $7\times10^{18}$ $cm^{-3}$, and according to some embodiments, in the range of about $1\times10^{17}$ $cm^{-3}$ to about $7\times10^{18}$ $cm^{-3}$ or in the range of about $4\times10^{18}$ $cm^{-3}$ to about $6\times10^{18}$ $cm^{-3}$. A highest silicon dopant concentration may be in the range of about $8\times10^{18}$ $cm^{-3}$ to about $1\times10^{22}$ $cm^{-3}$, and according to some embodiments, in the range of about $8\times10^{18}$ $cm^{-3}$ to about $2\times10^{19}$ $cm^{-3}$. According to some embodiments of the present invention, a highest silicon dopant concentration of a pattern may be at least about $1.2\times10^{19}$ $cm^{-3}$ and a lowest silicon dopant concentration of the same pattern may be no greater than about $6\times10^{18}$ $cm^{-3}$. According to still other embodiments of the present invention, a highest silicon dopant concentration of a pattern may be at least about $1.2\times10^{19}$ $cm^{-3}$ and a portion of the pattern having the lowest silicon dopant concentration may have insignificant silicon doping (i.e., nominally undoped). Moreover, patterns of modulated silicon doping may be provided with variable thickness, variable periods, variable dopant concentrations, repeating patterns, non-repeating patterns, symmetric patterns, asymmetric patterns, etc.

Moreover, a period of modulated silicon doping may be in the range of at least about 50 Angstroms or at least about 100 Angstroms. By way of example, a period of modulated silicon doping may by in the range of about 50 Angstroms to about 5000 Angstroms, or in the range of about 100 Angstroms to about 2500 Angstroms.

Figure 18:
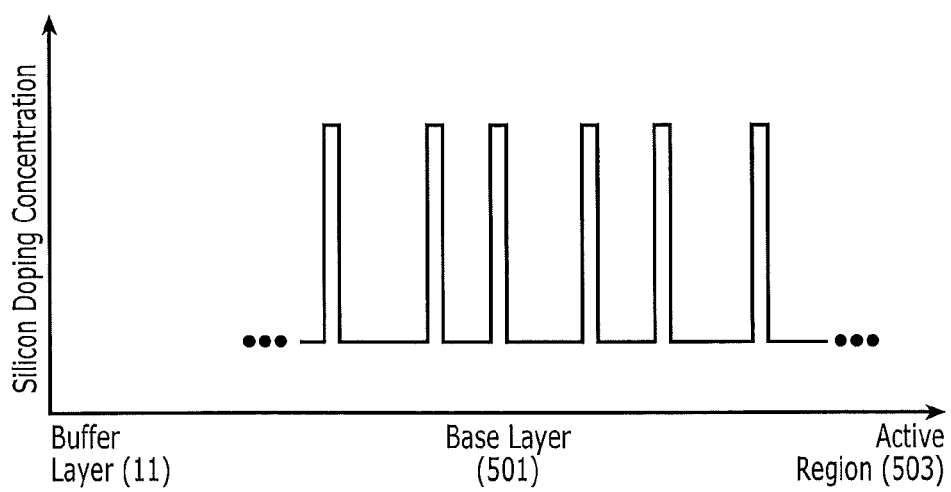

According to additional embodiments of the present invention, modulated silicon doping in base region 501 or portions thereof may be provided using delta doping as shown in FIG. 18. During epitaxial deposition of base region 501 and/or portions thereof, a silicon source gas (such as silane) may briefly be turned on and then off again to provide spikes in silicon doping at different thicknesses of base region 501. In addition to turning the silicon source gas on and off, a Group III element source gas for the Group III nitride (e.g., a gallium source gas) may be turned off or reduced while turning the silicon source gas on to further increase a concentration of silicon doping at the spike. Delta doping may also allow a relatively low flow of the silicon source gas between the spikes to provide a relatively low silicon doping between the spikes. The spikes may be relatively evenly spaced or not. According to some embodiments of the present invention, highly silicon doped regions of base region 501 formed by delta doping may be so thin as to be substantially two-dimensional sheets having silicon dopant concentrations of at least about $1\times10^{12}$ $cm^{-2}$, at least about $1\times10^{13}$ $cm^{-2}$, at least about $1\times10^{14}$ $cm^{-2}$, or even at least about $1\times10^{15}$ $cm^{-2}$, with thickness of less than about 10 Angstroms or less than about 2.5 Angstroms. Because the highly silicon doped regions provided using delta doping may be substantially two-dimensional sheets, doping concentrations may be measured per unit area (e.g., $cm^{-2}$). Modulation doping may be three-dimensional and as such, the doping concentrations may be measured per unit volume (e.g., $cm^{-3}$).

Moreover, delta doping may be provided in combination with modulation doping patterns such as those illustrated in FIGS. 6-17. By way of example, some portions of base region 501 may be doped according to one or more patterns of FIGS. 6-17, and other portions of base region 501 may be provided with periodic delta doping as discussed above with respect to FIG. 18. According to other embodiments of the present invention, periodic silicon delta doping may be superimposed on a pattern of modulated silicon doping discussed above with respect to FIGS. 6-17.

Figure 19:
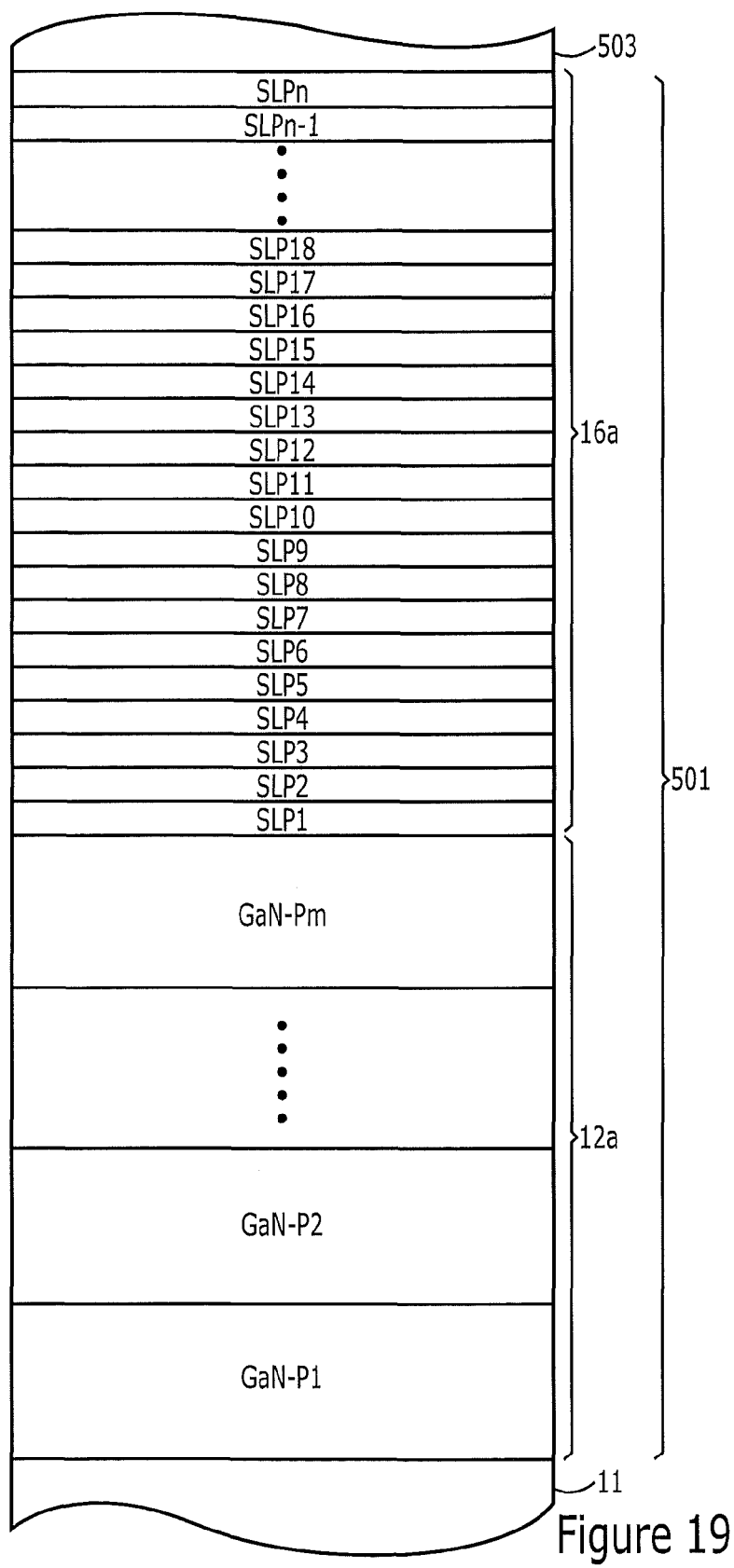
FIG. 19 is a schematic illustration of a base layer structure according to additional embodiments of the present invention.

FIG. 19 is a greatly enlarged cross sectional view of Group III nitride semiconductor base region 501 of FIG. 5 illustrating modulated silicon doping according to some embodiments of the present invention. As discussed above, base region 501 may include a GaN layer 12a and a superlattice 16a, and modulated silicon doping may be superimposed on one of GaN layer 12a or superlattice 16a, on both of GaN layer 12a and superlattice 16a, or on portions of GaN layer 12a and/or superlattice 16a. While not shown in FIG. 19, base region 501 may also include a second relatively thin n-GaN layer between GaN layer 12a and superlattice 16a as discussed above, for example, with respect to n-GaN layer 14 of FIGS. 1 and 2.

Superlattice 16a, for example, may include n periods SLP1 to SLPn, and each period of superlattice 16a may include a layer of $In_xGa_{1-x}N$ and a layer of $In_yGa_{1-y}N$, wherein X and Y are between 0 and 1 inclusive and X is not equal to Y. Accordingly, superlattice 16a may include alternating layers of $In_xGa_{1-x}N$ and $In_yGa_{1-y}N$. For example, X=0 and a thickness of each of the alternating layers of InGaN may be about 5 Angstroms to about 40 Angstroms thick inclusive, and a thickness of each of the alternating layers of GaN may be about 5 Angstroms to about 100 Angstroms thick inclusive. In some embodiments, GaN layers of superlattice 16a may be about 70 Angstroms thick and InGaN layers may be about 30 Angstroms thick to provide a superlattice period of about 100 Angstroms. Superlattice 16a may include from about 5 to about 50 superlattice periods SLP so that n may be in the range of about 5 and 50 (where a thickness of one superlattice period SLP equals one repetition each of $In_xGa_{1-x}N$ and $In_yGa_{1-y}N$ layers that comprise superlattice 16a). In some embodiments, superlattice 16a may include 25 superlattice periods SLP1 to SLP25 (e.g., n=25). In other embodiments, superlattice 16a may include 10 periods SLP1 to SLP10 (e.g., n=10). A number of superlattice periods, however, may be decreased by, for example, increasing thicknesses of the respective layers. Thus, for example, doubling a thickness of superlattice layers may be used with half the number of superlattice periods. Alternatively, numbers and thicknesses of superlattice periods may be independent of one another.

Superlattice 16a may be doped with an n-type impurity such as silicon at a concentration of from about $1\times10^{17}$ cm$^{-3}$ to about $5\times10^{19}$ cm$^{-3}$. Moreover, modulated silicon doping may be provided over a thickness of superlattice 16a so that a pattern of modulated silicon doping (e.g., as discussed above with respect to FIGS. 6-18) may be superimposed on a pattern of alternating layers of superlattice 16a (e.g., on a pattern of alternating layers of InGaN and GaN of superlattice 16a). Moreover, a period of modulated silicon doping may be greater than a period of alternating layers of superlattice 16a, and a period of modulated silicon doping may be an integer multiple of a period of alternating layers of superlattice 16a. According to other embodiments of the present invention, a period of modulated silicon doping may be independent of a period of alternating layers of superlattice 16a. A period of modulated silicon doping, for example, may be at least 2 times greater than a period of alternating layers of superlattice 16a.

By way of example, superlattice 16a may include alternating layers of InGaN and GaN having respective thicknesses of about 30 Angstroms and 70 Angstroms so that each superlattice period SLP1 to SLPn has a thickness of about 100 Angstroms. In addition, a period of modulated silicon doping may be about 500 Angstroms so that each period of modulated silicon doping is superimposed on 5 periods SLPj to SLPj+5 of superlattice 16a. Using the square pattern (or step function) of modulated silicon doping discussed above with respect to FIG. 6, for example, a first layer of relatively low silicon doping and a first layer of relatively high silicon doping may be provided over superlattice periods SLP1 to SLP5, a second layer of relatively low silicon doping and a second layer of relatively high silicon doping may be provided over superlattice periods SLP6 to SLP10, a third layer of relatively low silicon doping and a third layer of relatively high silicon doping may be provided over superlattice periods SLP11 to SLP15, etc., and thickness of the layers of relatively low and high silicon doping may be the same (e.g., approximately 250 Angstroms each) or different.

Moreover, layers of relatively high silicon doping may have a silicon dopant concentration that is at least about 1.5 times (50 percent) greater than layers of relatively low silicon dopant concentration, and according to some embodiments, at least about 2 times (100 percent) greater, at least about 3 times (200 percent) greater, at least about 10 times (one order of magnitude) greater, at least about 100 times (two orders of magnitude) greater, at least about 1,000 times (three orders of magnitude) greater, or even at least about 10,000 times (four orders of magnitude) greater. According to some embodiments of the present invention, layers of relatively high silicon doping may have a silicon dopant concentration that is at least about $1.2\times10^{19}$ cm$^{-3}$, and layers of relatively low silicon doping may have a silicon dopant concentration that is less than about $6\times10^{18}$ cm$^{-3}$.

While a square pattern (or step function) of modulated silicon doping is discussed by way of example, any pattern of modulated silicon doping (such as discussed above with respect to FIGS. 6-18) may be provided according to embodiments of the present invention. Moreover, a pattern and/or a period of modulated silicon doping may be different over different portions of superlattice 16a, and/or some portions of superlattice 16a may have modulated silicon doping while other portions of superlattice 16a may have relatively constant silicon doping (i.e., unmodulated silicon doping). For example, a first pattern and/or period of modulated silicon doping may be provide in portions of superlattice 16a adjacent GaN layer 12a and a second pattern and/or period of modulated silicon doping may be provided in portions of superlattice 16a adjacent active region 503. According to other embodiments, silicon doping may be modulated at different dopant concentrations without a repeating pattern or periodicity.

In addition, silicon doped layers may be provided adjacent superlattice 16a to provide a desired average silicon dopant concentration over the silicon doped layers and superlattice 16a. By providing superlattice 16a between substrate 10 and active region 503, a better surface may be provided on which to grow InGaN-based active region 503. While not wishing to be bound by any theory of operation, the inventors believe that strain effects in superlattice 16a may provide a growth surface that is conducive to growth of high-quality InGaN-containing active region 503. Further, superlattice 16a may influence an operating voltage of the device. Appropriate choice of superlattice thicknesses and composition parameters may reduce operating voltage and increase optical efficiency.

In addition or in an alternative, modulated silicon doping may be provided in GaN layer 12a. GaN layer 12a may include a plurality of GaN sub-layers GaN-P1 to GaN-Pm with each sub-layer including one period of modulated silicon doping. According to some embodiments of the present invention, each sub-layer GaN—P may include one layer of relatively low silicon dopant concentration and one layer of relatively high silicon dopant concentration to provide one period of a square pattern (or step function) of modulated silicon doping as discussed above with respect to FIG. 6. For example, each layer of relatively high silicon dopant concentration may have a silicon dopant concentration that is at least 50 percent greater than each layer of relatively low silicon dopant concentration, and according to some embodiments, at least 100 percent greater. For example, layers of relatively high silicon dopant may have a silicon dopant concentration that is at least about $1.2\times10^{18}$ cm$^{-3}$ and a thickness less than about 1000 Angstroms, and layers of relatively low silicon doping may have a silicon dopant concentration that is less than about $6\times10^{18}$ cm$^{-3}$ and a thickness less than about 1000 Angstroms. Moreover, a period of modulated silicon doping may be less than about 1000 Angstroms, and/or thickness of each of the layers of relatively high and low silicon dopant concentrations may be in the range of about 300 Angstroms to about 700 Angstroms (e.g., about 500 Angstroms).

A same pattern and period of modulated silicon doping may extend through both of GaN layer 12a and superlattice 16a. According to other embodiments of the present invention, a pattern and/or period of modulated silicon doping provided in GaN layer 12a may be different than a pattern and/or period of modulated silicon doping provided in superlattice 16a. According to still other embodiments of the present invention, modulated silicon doping may be provided in only one of GaN layer 12a or superlattice 16a. According to yet other embodiments of the present invention, different portions of GaN layer 12a may have different periods and/or patterns of modulated silicon doping, and/or one portion of GaN layer 12a may have modulated silicon doping while another portion of GaN layer 12a has relatively constant silicon doping (i.e., unmodulated silicon doping). In addition or in an alternative, modulated silicon doping may be provided in n-AlGaN buffer layer 11. Moreover, regions of buffer layer 11 and/or base region 501 may be provided without modulated silicon doping (e.g., with a relatively constant silicon doping concentration or without significant silicon doping) between substrate 10 and regions with modulated silicon doping.

Use of modulated silicon doping structures in LED structures according to embodiments of the present invention may allow higher average silicon dopant concentrations while reducing cracking of epitaxial layers (e.g., active region 503) formed thereon. Increased silicon dopant concentrations may reduce operating voltages by both reducing spreading resistance (i.e., resistance in a direction parallel with respect to a surface of substrate 10) and contact resistance of a metal contact that may be formed thereon. A metal electrode/contact may be formed directly on a bottom surface of base region 501 by removing substrate 10 and buffer layer 11 to provide a vertical device, or a metal electrode/contact may be formed directly on a portion of a top surface of base region 501 by removing portions of layers/regions 32, 30, 22, and 503 (while maintaining other portions of layers/regions 32, 30, 22, and 503) to provide a horizontal device.

Due to differences in lattice constants and coefficients of thermal expansion of GaN and SiC, GaN may be subjected to tensile stress when formed on an SiC substrate, so that cracking may occur in the GaN and/or layers formed thereon. Because silicon is a smaller atom than GaN, silicon dopant may increase this tensile stress. By providing modulated silicon dopant according to embodiments of the present invention, cracking may be reduced, n-side voltage drops may be reduced, and/or lateral current spreading may be improved.

Without being bound to any particular theory, the inventors believe that modulation of dopant concentrations (e.g., modulation of silicon dopant concentrations) may improve surface morphologies of epitaxial Group III nitride semiconductor regions/layers by reducing pitting and/or cracking. For example, sustained growth of epitaxial GaN at relatively high dopant concentrations may induce facets that increase formation/propagation of cracks/pits/dislocations. By alternating layers of relatively high and low dopant concentrations, however, the inventors believe that formation/propagation of facets/dislocations/pits/cracks may be suppressed by forming the layers of relatively low dopant concentrations between the layers of relatively high dopant concentrations. To the extent that dislocations are generated during deposition of a layer of relatively high dopant concentration, subsequent deposition of a layer of relatively low dopant concentration may enhance dislocation growth annihilation and/or termination of pit propagation.

Accordingly, modulation of dopant concentrations may allow a higher dopant concentration than might otherwise be available to thereby reduce resistivity while maintaining a high crystal quality. Without modulation of dopant concentrations, silicon dopant concentrations greater than about $5\times10^{18}$ cm$^{-3}$ in Group III semiconductor nitride materials (e.g., GaN) may be difficult to achieve without reducing crystal quality. With modulation of dopant concentrations, relatively high quality epitaxial Group III semiconductor nitride layers may be formed with average silicon dopant concentrations greater than about $1\times10^{19}$ cm$^{-3}$, and according to some embodiments, greater than $1\times10^{20}$ cm$^{-3}$ or even $1\times10^{21}$ cm$^{-3}$.

Figure 20:
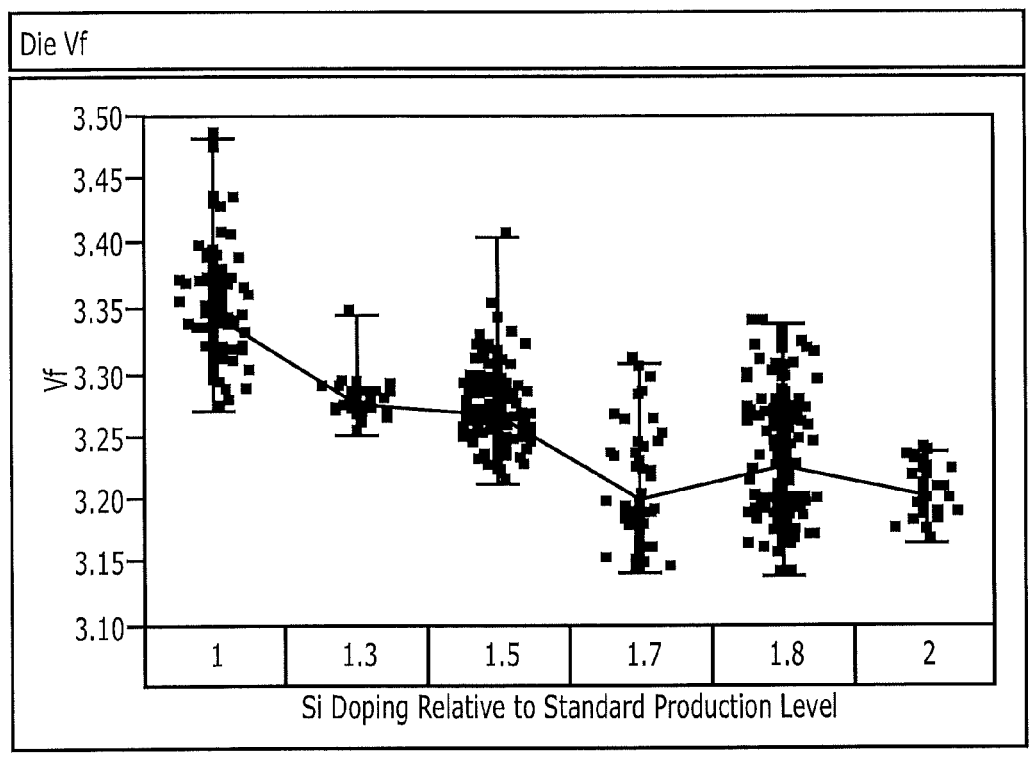
FIG. 20 is a graph illustrating forward voltages (Vf) for different average silicon doping levels of an n-GaN layer in a horizontal LED device according to embodiments of the present invention.

FIG. 20 is a graph illustrating forward voltages (Vf) for different average silicon doping levels of n-GaN layer 12a in a horizontal LED device (with both contacts on a same side of the LED). Sample 1 represents devices fabricated with a standard average production level of silicon doping of n-GaN layer 12a. Samples 1.3, 1.5, 1.7, 1.8, and 2 represent devices fabricated using modulated silicon doping of n-GaN layer 12a according to embodiments of the present invention. More particularly, sample 1.3 represents devices fabricated with an average of 1.3 times the standard average production level of silicon doping of n-GaN layer 12a; sample 1.5 represents devices fabricated with an average of 1.5 times the standard average production level of silicon doping of n-GaN layer 12a; sample 1.7 represents devices fabricated with an average of 1.7 times the standard average production level of silicon doping of n-GaN layer 12a; sample 1.8 represents devices fabricated with an average of 1.8 times the standard average production level of silicon doping of n-GaN layer 12a; and sample 2 represents devices fabricated with an average of 2 times the standard average production level of silicon doping of n-GaN layer 12a. As shown in FIG. 20, increased levels of average silicon doping of n-GaN layer 12a may substantially reduce a forward voltage drop through the LED device thereby reducing operating voltage and/or increasing efficiency. Moreover, by using modulated silicon doping to provide increased average levels of silicon doping through n-GaN layer 12a, crystal quality of a subsequently formed active layer(s) may be improved.

According to some embodiments of the present invention, a silicon dopant concentration of a GaN layer 12a of base region 501 (or portions thereof) may be modulated according to the square pattern of FIG. 6. For example, each layer of relatively low silicon dopant concentration may have a thickness of about 700 Angstroms and a silicon dopant concentration of about $6\times10^{18}$ cm$^{-3}$, each layer of relatively high silicon dopant concentration may have a thickness of about 700 Angstroms and a silicon dopant concentration of about $1.2\times10^{19}$ cm$^{-3}$, and a 50 Angstrom graded transition layer may be provided at each transition between layers of different dopant concentration (to provide a period of about 1500 Angstroms). By improving a crystal quality of a subsequently aimed active region 503, performance of a light emitting diode (LED) may be improved.

Some embodiments of the present invention may thus provide improved Group III nitride semiconductor regions/layers having reduced resistivity and/or improved crystal quality. According to some embodiments of the present invention, an epitaxial Group III nitride semiconductor region/layer may be formed with modulated dopant concentrations to have a sheet resistivity less that about 30 ohms/square, and according to some embodiments, less than about 20 ohms/square or even less than about 10 ohms/square.

Modulation of dopant concentrations according to embodiments of the present invention may be useful in applications where a growth substrate has a coefficient of thermal expansion (CTE) that is less than a CTE of the growth layer. Without modulated dopant concentrations, Group III nitride semiconductor materials with relatively high dopant concentrations may be prone to cracking when formed on substrates having a lower CTE. Modulation of dopant concentrations, for example, may be useful for epitaxial growth of a Group III nitride semiconductor material(s) (e.g., GaN, InGaN, AlGaN, InAlGaN, InN, AlN, InAlN, etc.) having a relatively high CTE on a silicon carbide (SiC) or silicon (Si) substrate having a relatively low CTE.

Modulation of dopant concentrations according to embodiments of the present invention may also be useful in applications where a Group III nitride semiconductor material is epitaxially deposited on a substrate including a surface pattern such as a saw tooth surface pattern, a surface pattern of posts, a surface pattern of ridges, etc. Saw tooth surface patterns may be provided, for example, on sapphire substrates used for epitaxial growth of Group III nitride semiconductor LED structures, and the saw tooth surface pattern may increase introduction of facets in the epitaxial layer being grown thereon. As noted above, modulation of dopant concentrations according to embodiments of the present invention, may reduce formation and/or propagation of facets to improve a crystal quality of the epitaxial layer and/or reduce or eliminate pits.

While modulated n-type silicon doping of Group III nitride semiconductor regions is discussed above by way of example, modulated doping of Group III nitride semiconductor base region 501 may be provided according to other embodiments of the present invention using other n-type dopants such as germanium (Ge), carbon (C), tin (Sn), oxygen (O), sulfur (S), selenium (Se), or any other suitable n-type dopant. According to still other embodiments of the present invention, modulated doping of Group III nitride semiconductor regions may be provided using p-type dopants such as magnesium (Mg), zinc (Zn), calcium (Ca), strontium (Sr), or any other suitable p-type dopant. With a p-type dopant like magnesium, conductivity types of layers of FIGS. 1, 2, 3, 4, 5, and 11 may be reversed relative to those discussed above. Moreover, modulated doping may be provided according to other embodiments of the present invention using co-doping, for example, using a combination of two or more different n-type dopants or using a combination of two or more different p-type dopants. According to still other embodiments of the present invention, modulated doping may be provided using different dopants of the same conductivity type in alternating layers of high and low dopant concentrations. According to other embodiments of the present invention, doped Group III nitride semiconductor regions (p-type or n-type) may be formed on respective LED active regions.

Doped Group III nitride semiconductor regions with modulated doping according to embodiments of the present invention may thus have n-type conductivity or p-type conductivity. Moreover, n-type doped Group III nitride semiconductor regions with modulated doping may have a very low average n-type majority carrier concentration ($N^{--}$), a low average n-type majority carrier concentration ($N^-$), a moderate n-type majority carrier concentration (N), a high average n-type majority carrier concentration ($N^+$), or a very high average n-type majority carrier concentration ($N^{++}$). P-type doped Group III nitride semiconductor regions with modulated doping may have a very low average p-type majority carrier concentration ($P^{--}$), a low average p-type majority carrier concentration ($P^-$), a moderate p-type majority carrier concentration (P), a high average p-type majority carrier concentration ($P^+$), or a very high average p-type majority carrier concentration ($P^{++}$).

Semiconductor layers/regions/structures 11, 501, 12a, 16a, 503, 22, 30, and 32 of FIGS. 5 and 11 may be formed by epitaxial deposition on silicon carbide substrate 11. According to some embodiments, these layers may be formed continuously in a same reaction chamber by changing flows of reactant source gases during the deposition. A desired pattern of modulated silicon doping may be provided, for example, by increasing and decreasing and/or alternating off/on a flow of a silicon source gas (e.g., silane) during deposition of GaN layer 12a and/or superlattice 16a.

Moreover, embodiments of the present invention may be used to provide either vertical or horizontal devices. While FIG. 5 shows ohmic metal contact 23 on substrate 10 by way of example, substrate 10 and buffer layer 11 may be removed before forming ohmic metal contact 23 so that ohmic metal contact is formed directly on base region 501 to provide a vertical device with metal contacts on opposite sides of the device. According to other embodiments of the present invention, portions of layers/regions 32, 30, 22, and 503 may be removed (while maintaining portions of layers/regions 32, 30, 22, and 503) to expose a portion of base region 501, and an ohmic metal contact may be formed on the exposed portion of base region 501 to provide a horizontal device with both metal contacts on a same side of the device. While embodiments of the present invention have been described with reference to gallium nitride based devices, teachings and benefits of the present invention may also be provided in other Group III nitrides.

Group III nitride based LEDs according to some embodiments of the present invention, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board, or wire bonded. A vertical device (without or without the growth substrate) may have a first terminal solder bonded to a carrier substrate or printed circuit board and a second terminal wire bonded to the carrier substrate or printed circuit board. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated herein in their entirety by reference.

While modulated doping has been discussed above by way of example in Group III nitride light emitting diode structures by way of example, modulated doping according to embodiments of the present invention may be used in other devices and/or in other semiconductor materials. For example, modulated doping according to embodiments of the present invention may be used in semiconductor devices such as light emitting diodes, Shottkey diodes, p-n diodes, transistors, thyristors, photodetectors, lasers, or any other semiconductor device where reduction of series resistance may be useful, for example, to increase efficiency, reduce response time, etc. Moreover, modulated doping according to embodiments of the present invention may be provided in semiconductor materials such as silicon doped Group III nitride semiconductor materials, n-type doped silicon carbide, p-type doped silicon, silicon doped gallium arsenide, etc.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
   a doped semiconductor region wherein a dopant concentration of the semiconductor region is modulated over a plurality of intervals wherein each interval includes at least one portion having a relatively low dopant concentration and at least one portion having a relatively high dopant concentration wherein the doped semiconductor region comprises a superlattice and wherein the modulated dopant concentration is provided through at least portions of the superlattice; and
   a semiconductor active region on the doped semiconductor region.

2. A semiconductor device according to claim 1 wherein the semiconductor region comprises a doped Group III nitride semiconductor region.

3. A semiconductor device according to claim 1 wherein the doped semiconductor region includes first and second adjacent intervals of modulated dopant concentration, wherein a first portion of the first interval has a first relatively low dopant concentration and a second portion of the first interval has a first relatively high dopant concentration, wherein a first portion of the second interval has a second relatively low dopant concentration and a second portion of the second interval has a second relatively high dopant concentration, wherein the first relatively high dopant concentration is greater than the first and second relatively low dopant concentrations, and wherein the second relatively low dopant concentration is less than the first and second relatively high dopant concentrations.

4. A semiconductor device according to claim 3 wherein the second portion of the first interval is between the first portions of the first and second intervals, and wherein the first portion of the second interval is between the second portions of the first and second intervals.

5. A semiconductor device according to claim 4 wherein the first and second relatively high dopant concentrations are different, and/or wherein the first and second relatively low dopant concentrations are different.

6. A semiconductor device according to claim 4 wherein the first and second relatively high dopant concentrations are the same, and/or wherein the first and second relatively low dopant concentrations are the same.

7. A semiconductor device according to claim 1 wherein the semiconductor active region comprises a multi-quantum well structure.

8. A semiconductor device according to claim 1 wherein the plurality of intervals define a repeating pattern of different dopant concentrations.

9. A semiconductor device according to claim 1 wherein the doped semiconductor region comprises a silicon doped Group III nitride semiconductor region and wherein a dopant concentration of silicon is modulated in the doped Group III nitride semiconductor region.

10. A semiconductor device according to claim 1 wherein the intervals of the modulated dopant concentration define a repeating pattern with each interval defining a period of the repeating pattern, wherein the period of the repeating pattern is greater than a period of the superlattice.

11. A semiconductor device according to claim 1 wherein the superlattice comprises a superlattice pattern of alternating layers having different concentrations of indium wherein a first of the alternating layers of the superlattice pattern has a thickness of about 5 Angstroms to about 40 Angstroms, and wherein a second of the alternating layers of the superlattice pattern has a thickness of about 5 Angstroms to about 100 Angstroms.

12. A semiconductor device according to claim 1 wherein the doped semiconductor region comprises a GaN layer and wherein the modulated dopant concentration is provided through at least portions of the GaN layer.

13. A semiconductor device according to claim 12 further comprising:
wherein the doped semiconductor region comprises a Group III nitride superlattice between the GaN layer and the active region.

14. A semiconductor device according to claim 1 wherein a relatively high dopant concentration of a respective interval is at least 50 percent greater than a relatively low dopant concentration of the respective interval.

15. A semiconductor device according to claim 14 wherein the relatively high dopant concentration of the respective interval is at least about $1.2 \times 10^{19}$ cm-3 and wherein the relatively low dopant concentration of the respective interval is no greater than about $6 \times 10^{18}$ cm-3.

16. A semiconductor device according to claim 1 further comprising:
a silicon carbide substrate on the doped semiconductor region so that the doped semiconductor region is between the silicon carbide substrate and the semiconductor active region.

17. A semiconductor device according to claim 1 wherein the doped semiconductor region comprises a doped Group III nitride semiconductor region, the semiconductor device further comprising:
a silicon carbide substrate; and
a doped AlGaN buffer layer between the silicon carbide substrate and the doped Group III nitride semiconductor region wherein the doped Group III nitride semiconductor region is between the doped AlGaN buffer layer and the semiconductor active region, and wherein a dopant concentration of the doped AlGaN buffer layer is modulated.

18. A semiconductor device according to claim 1 further comprising:
a semiconductor contact layer on the semiconductor active region so that the semiconductor active region is between the semiconductor contact layer and the doped semiconductor region, and wherein the semiconductor contact layer and the doped semiconductor region have opposite conductivity types.

19. A semiconductor device according to claim 1 wherein the doped semiconductor region comprises a doped Group III nitride semiconductor region and wherein the dopant concentration of the Group III nitride semiconductor region is modulated over the plurality of intervals to provide a sheet resistivity of less than about 30 ohms/square.

20. A semiconductor device according to claim 19 wherein the doped Group III nitride semiconductor region comprises a silicon doped GaN semiconductor layer.

21. A semiconductor device according to claim 19 wherein the Group III nitride semiconductor region is modulated to provide a sheet resistivity of less than about 20 ohms/square.

22. A semiconductor device according to claim 19 wherein the Group III nitride semiconductor region is modulated to provide a sheet resistivity of less than about 10 ohms/square.

23. A semiconductor device according to claim 11 wherein a period of the superlattice pattern includes one of the first of the alternating layers of the superlattice pattern and one of the second of the alternating layers of the superlattice pattern so that the period of the superlattice pattern is about 10 Angstroms to about 140 Angstroms.

24. A method of forming a semiconductor device, the method comprising:
forming a doped semiconductor region wherein a dopant concentration of the semiconductor region is modulated over a plurality of intervals wherein each interval includes at least one portion having a relatively low dopant concentration and at least one portion having a relatively high dopant concentration, wherein the doped semiconductor region comprises a superlattice and wherein the modulated dopant concentration is provided through at least portions of the superlattice; and
forming a semiconductor active region on the doped semiconductor region so that a current path is defined through the doped semiconductor region and the semiconductor active region.

25. A method according to claim 24 wherein the doped semiconductor region comprises a doped Group III nitride semiconductor region.

26. A method according to claim 24 wherein the doped semiconductor region includes first and second adjacent intervals of modulated dopant concentration, wherein a first portion of the first interval has a first relatively low dopant concentration and a second portion of the first interval has a first relatively high dopant concentration, wherein a first portion of the second interval has a second relatively low dopant concentration and a second portion of the second interval has a second relatively high dopant concentration, wherein the first relatively high dopant concentration is greater than the first and second relatively low dopant concentrations, and wherein the second relatively low dopant concentration is less than the first and second relatively high dopant concentrations.

27. A method according to claim 26 wherein the second portion of the first interval is between the first portions of the first and second intervals, and wherein the first portion of the second interval is between the second portions of the first and second intervals.

28. A method according to claim 27 wherein the first and second relatively high dopant concentrations are different, and/or wherein the first and second relatively low dopant concentrations are different.

29. A method according to claim 27 wherein the first and second relatively high dopant concentrations are the same, and/or wherein the first and second relatively low dopant concentrations are the same.

30. A method according to claim 24 wherein the semiconductor active region comprises a multi-quantum well structure.

31. A method according to claim 24 wherein forming a semiconductor active region precedes forming the doped semiconductor region, wherein forming the doped semiconductor region comprises forming the doped semiconductor region on the semiconductor active region.

32. A method according to claim 24 wherein the plurality of intervals define a repeating pattern of different dopant concentrations.

33. A method according to claim 24 wherein the doped semiconductor region comprises a silicon doped Group III nitride semiconductor region and wherein a dopant concentration of silicon is modulated in the Group III nitride semiconductor region.

34. A method according to claim 24 wherein the intervals of the modulated dopant concentration define a repeating pattern with each interval defining a period of the repeating pattern, wherein the period of the repeating pattern is greater than a period of the superlattice.

35. A method according to claim 24 wherein the superlattice comprises a superlattice pattern of alternating layers having different concentrations of indium wherein a first of the alternating layers of the superlattice pattern has a thickness of about 5 Angstroms to about 40 Angstroms, and wherein a second of the alternating layers of the superlattice pattern has a thickness of about 5 Angstroms to about 100 Angstroms.

36. A method according to claim 24 wherein the doped semiconductor region comprises a GaN layer and wherein the modulated dopant concentration is provided through at least portions of the GaN layer.

37. A method according to claim 36 wherein forming the doped semiconductor region precedes forming the semiconductor active region, wherein the doped semiconductor region comprises a Group III nitride superlattice between the GaN layer and the active region.

38. A method according to claim 24 wherein a relatively high dopant concentration of a respective interval is at least 50 percent greater than a relatively low dopant concentration of the respective interval.

39. A method according to claim 38 wherein the relatively high dopant concentration of the respective interval is at least about $1.2 \times 10^{19}$ cm-3 and wherein the relatively low dopant concentration of the respective interval is no greater than about $6 \times 10^{18}$ cm-3.

40. A method according to claim 24 wherein forming the doped semiconductor region comprises forming a doped Group III nitride semiconductor region on a silicon carbide substrate, wherein forming the semiconductor active region comprises forming the semiconductor active region on the doped Group III nitride semiconductor region so that the doped Group III nitride semiconductor region is between the silicon carbide substrate and the semiconductor active region.

41. A method according to claim 24 further comprising:
before forming the doped semiconductor region, forming a doped AlGaN buffer layer on a silicon carbide substrate, wherein forming the doped semiconductor region comprises forming a Group III nitride semiconductor region on the AlGaN buffer layer, and wherein a dopant concentration of the doped AlGaN buffer layer is modulated.

42. A method according to claim 24 further comprising:
forming a semiconductor contact layer on the semiconductor active region so that the semiconductor active region is between the semiconductor contact layer and the doped semiconductor region wherein the semiconductor contact layer and the doped semiconductor region have opposite conductivity types.

43. A method according to claim 35 wherein a period of the superlattice pattern includes one of the first of the alternating layers of the superlattice pattern and one of the second of the alternating layers of the superlattice pattern so that the period of the superlattice pattern is about 10 Angstroms to about 140 Angstroms.

* * * * *